(12) United States Patent
Chao et al.

(10) Patent No.: US 8,949,292 B2
(45) Date of Patent: Feb. 3, 2015

(54) INTEROPERABILITY FORMAT TRANSLATION AND TRANSFORMATION BETWEEN IFC ARCHITECTURAL DESIGN FILE AND SIMULATION FILE FORMATS

(71) Applicant: International Business Machines Corporation, Armonk, NY (US)

(72) Inventors: Tian-Jy Chao, Bedford, NY (US); Younghun Kim, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 38 days.

(21) Appl. No.: 13/648,798

(22) Filed: Oct. 10, 2012

(65) Prior Publication Data
US 2013/0339403 A1 Dec. 19, 2013

Related U.S. Application Data

(60) Provisional application No. 61/659,134, filed on Jun. 13, 2012.

(51) Int. Cl.
*G06F 7/00* (2006.01)
*G06F 12/00* (2006.01)
(Continued)

(52) U.S. Cl.
CPC ...... *G06F 17/30569* (2013.01); *G06F 17/5009* (2013.01); *Y10S 707/94* (2013.01); *G06Q 10/0637* (2013.01)
USPC .............. 707/810; 707/821; 707/940; 703/13

(58) Field of Classification Search
CPC .......... G06F 17/30569; G06F 17/5009; G06Q 10/0637; Y10S 707/94

USPC ............................ 707/810, 821, 940; 703/13
See application file for complete search history.

(56) References Cited

U.S. PATENT DOCUMENTS 6,708,186 B1 3/2004 Claborn et al.
7,275,237 B1 * 9/2007 Schneider et al. ............ 717/108
(Continued)

OTHER PUBLICATIONS

"Building SMART", http://www.buildingsmart-tech.org/specifications/ifc-view-definition.com, Copyright 2008-2012 (printed on Oct. 3, 2012).

(Continued)

*Primary Examiner* — Greta Robinson
*Assistant Examiner* — Brian E. Weinrich
(74) *Attorney, Agent, or Firm* — Scully, Scott, Murphy & Presser, P.C.; Louis J. Percello, Esq.

(57) ABSTRACT

Automatically translating a building architecture file format (Industry Foundation Class) to a simulation file, in one aspect, may extract data and metadata used by a target simulation tool from a building architecture file. Interoperability data objects may be created and the extracted data is stored in the interoperability data objects. A model translation procedure may be prepared to identify a mapping from a Model View Definition to a translation and transformation function. The extracted data may be transformed using the data stored in the interoperability data objects, an input Model View Definition template, and the translation and transformation function to convert the extracted data to correct geometric values needed for a target simulation file format used by the target simulation tool. The simulation file in the target simulation file format may be generated.

13 Claims, 9 Drawing Sheets

(51) Int. Cl.
*G06F 17/30* (2006.01)
*G06F 17/50* (2006.01)
*G06Q 10/06* (2012.01)
*G06F 15/16* (2006.01)

(56) References Cited

U.S. PATENT DOCUMENTS

| | | |
|---|---|---|
| 2006/0190312 A1* | 8/2006 | Onuma et al. ............... 705/7 |
| 2008/0015823 A1 | 1/2008 | Arnold et al. |
| 2008/0281573 A1 | 11/2008 | Seletsky et al. |
| 2010/0106674 A1 | 4/2010 | McLean et al. |
| 2011/0093424 A1* | 4/2011 | Zimmermann et al. ........ 706/47 |
| 2011/0209081 A1* | 8/2011 | Chen et al. ................. 715/771 |
| 2011/0307281 A1* | 12/2011 | Creveling et al. ........... 705/7.11 |
| 2012/0203806 A1 | 8/2012 | Panushev |
| 2012/0215500 A1* | 8/2012 | Ciuti et al. ................... 703/1 |
| 2012/0296609 A1* | 11/2012 | Khan et al. ................... 703/1 |
| 2013/0144546 A1 | 6/2013 | Brackney et al. |
| 2013/0218924 A1* | 8/2013 | Kim et al. ................... 707/770 |

OTHER PUBLICATIONS

"XQuery 1.0: An XML Query Language (Second Edition)", http://www.w3.org/TR/xquery/, Dec. 14, 2010 (printed on Oct. 3, 2012).

http://www.underground.com, Copyright 2012, (printed on Oct. 3, 2012).

"XML Editor, Data Management, UML and Web Services Tools", http://www.xmlspy.com, Copyright 2005-2012 Altova, (printed on Oct. 3, 2012).

Rodriguez, A., "RESTful Web services: The basics", http://www.ibm.com/developerworks/webservices/library/ws-restful/, Nov. 6, 2008, (printed on Oct. 3, 2012).

http://www.w3.org/2001/XMLSchema-instance, (printed on Oct. 3, 2012).

"National Weather Service", http://www.weather.gov, (printed on Oct. 3, 2012).

http://www.buildingsmart-tech.org/ifcXML/IFC2x3/FINAL/IFC2X3.xsd, (printed on Oct. 3, 2012).

"Model View Definitions", http://buildingsmart.com/standards/mvd, (printed on Oct. 3, 2012).

http://apps1.eere.energy.gov/buildings/energyplus/energyplus_about.cfm, May 25, 2012, (printed on Oct. 3, 2012).

Office Action dated Jun. 20, 2014 received in U.S. Appl. No. 13/676,216.

Office Action dated Jun. 20, 2014 received in U.S. Appl. No. 13/648,785.

* cited by examiner

INTEROPERABILITY FORMAT TRANSLATION AND TRANSFORMATION BETWEEN IFC ARCHITECTURAL DESIGN FILE AND SIMULATION FILE FORMATS

CROSS-REFERENCE TO RELATED APPLICATION

This application claims the benefit of U.S. Provisional Application No. 61/659,134 filed on Jun. 13, 2012, which is incorporated by reference herein in its entirety.

STATEMENT REGARDING FEDERALLY SPONSORED RESEARCH OR DEVELOPMENT

This invention was made with Government support under Grant No. DE-EE0004261 awarded by Department of Energy. The Government has certain rights in this invention. (IBM Contract No.: 4352-IBM-DOE-4261)

FIELD

The present application relates generally to computers, and computer applications, and more particularly to interoperability format translation and transformation between Industry Foundation Class (IFC) architectural design file and simulation file formats such as EnergyPlus and/or Radiance.

BACKGROUND

In Building Information Modeling (BIM), various tools are used throughout various BIM phases such as architecture design, construction, simulation, and operations, and others, in generating electronic or digital representations of physical and functional characteristics of a facility or building and managing them. Each tool used in one or more of those phases has its own file and data format. There is no standard other than Industry Foundation Class (IFC), and for the most part, no interoperability among the tools. BIM Tools and File formats used by BIM tools, e.g., include design tools such as Autodesk AutoCAD™ using .DWG and .DWF formats, Revit™ using .RVT and .RFA formats, Google™ Sketchup using .SKP format, simulation tools such as EnergyPlus, an energy simulation tool using .IDF format, Radiance, a lighting simulation tool using .RAD format, CONTAM, an airflow/contaminant simulation using .PRJ format. For the BIM life cycle, all those different kinds of file formats need to be supported. However, no interoperability between various BIM tools of different phases of the BIM Lifecycle Moreover, little has been done to convert architecture design IFC file format to EnergyPlus (.IDF) file format, which is used by one of the popular energy simulation tools, i.e., EnergyPlus. One of the reasons is that it is quite complex both on the input and the output sides. For more description of EnergyPlus, see, http://apps1.eere.energy.gov/buildings/energyplus/energyplus_about.cfm. (note the blank spaces are added in the URL so that the text does not automatically convert to a hypertext link, in order to comply with the USPTO requirement that the specification does not contain an embedded hypertext).

On the input side, there are complexities in processing the input files. First, the architecture design files in IFC or in IFCXML, which can be converted from an IFC file using existing conversion tools, are huge and very difficult to parse. An average size of IFC file could be several hundreds of Mega bytes. Conventional desktop computers are limited with memory and central processing unit (CPU) power and unable to read in the entire file and keep it in the memory to query the elements, e.g., parsing using DOM parser for IFCXML files. Instead, the files must be parsed in an iterative way. What makes the matter more complicated is the enclosing IFC element that references the smaller or atomic elements often defined after the smaller or atomic elements, which are defined first in the files. Therefore, multiple passes of parsing must be executed to finally obtain the value in the targeted atomic elements.

On the output side, there are other complexities too. In the building domain, multiple representations of a building object are possible. Intelligence is required to select only those necessary objects required by the simulation tools for an area, e.g., energy simulation. Unnecessary objects in the output file can potentially increase the size of the file, and consequently, increase the computational time and resources significantly while adding no value to the simulations. In addition, data needs to be transformed and translated to be used by the simulation tools. Furthermore, it is difficult to identify the necessary mapping from the Model View Definition (MVD) to create the necessary the translation and transformation functions for a target simulation tool, e.g., EnergyPlus for energy simulation and Radiance for lighting simulation In summary, architectural design files (e.g., IFC) have different file formats from the files that simulation tools use, e.g., energy simulation files as such EnergyPlus IDF files. Currently, EnergyPlus IDF files can be manually created for EnergyPlus to use. However, this manual process is time consuming and requires significant domain knowledge in both the simulation areas, e.g., energy simulation and/or lighting simulation, as well as the simulation tools, e.g., EnergyPlus and/or Radiance. In an example of a classroom setting, an estimated 100 hours per student was spent in using the data in architectural design file in IFC to manually create an .IDF file for use by EnergyPlus to run energy simulation. Hence, current manual efforts in translation and transformation input files and producing output files for numerous different building information models are both difficult and inefficient. Moreover, there is no automated way to extract data to create energy simulation files.

BRIEF SUMMARY

A method of automatically translating and transforming a building architecture file format to a simulation file, in one aspect, may comprise extracting from a building architecture file, data and metadata used by a target simulation tool, e.g., energy simulation tool EnergyPlus and/or lighting simulation tool Radiance. The method may also comprise creating interoperability data objects and storing the extracted data in the interoperability data objects. The method may further comprise preparing a model translation procedure to identify a mapping from a Model View Definition to a translation and transformation function. The method may also comprise transforming the extracted data using the data stored in the interoperability data objects, an input Model View Definition template, and the translation and transformation function to convert the extracted data to correct geometric values needed for a target simulation file format used by the target simulation tool. The method may also comprise generating the simulation file in the target simulation file format.

A method of automatically translating and transforming a building architecture file format to a simulation file, in another aspect, may comprise extracting geometry data, metadata and context data from an Industry Foundation Class architectural design file, the geometry data, metadata and context data selected based on a Model View Definition template. The method may also comprise storing the extracted data as interoperability data objects. The method may further comprise identifying a mapping from the Model View Definition template to one or more format translation and transformation functions. The method may also comprise translating and transformation the data stored as the interoperability data objects by executing said one or more format translation and transformation functions into a selected target simulation tool format.

A system for automatically translating and transforming a building architecture file format to a simulation file, in one aspect, may comprise an extract data module operable to extract from an input building architecture file, data and metadata used by a target simulation tool. The system may also comprise a create interoperability data object module operable to create interoperability data objects and store the extracted data in the interoperability data objects. The system may further comprise a prepare model translation procedure module operable to prepare a model translation procedure to identify a mapping from a Model View Definition to a translation and transformation function. The system may also comprise a convert data module operable to transform the extracted data using the data stored in the interoperability data objects, an input Model View Definition template, and the translation and transformation function to convert the extracted data to correct geometric values needed for a target simulation file format used by the target simulation tool. The system may also comprise a targeted output file generation module operable to generate the simulation file in the target simulation file format.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

BRIEF DESCRIPTION OF THE SEVERAL
VIEWS OF THE DRAWINGS

DETAILED DESCRIPTION

An embodiment of the present disclosure provides a mechanism for interoperability and format translation of building architecture design files (e.g., IFC) and other file formats used by building simulation tools such as energy and lighting simulation tools, e.g., EnergyPlus, Radiance, via the use of industry standard format, i.e., Model View Definition (MVD). For example, the mechanism of the present disclosure may properly and flexibly convert the IFC files to generate energy simulation EnergyPlus file format (IDF) and lighting simulation Radiance (.RAD) file formats. In another embodiment of the present disclosure, the generated energy simulation EnergyPlus file format (IDF) can then be used to generate lighting simulation Radiance (.RAD) file formats.

In one embodiment of the present disclosure, a process of creating other file formats from design files are automated by programmably extracting metadata, other context information, and selected actual values parsed from design files (IFC). An embodiment of the present disclosure enables the use of standard formats, e.g., IFC and Model View Definition (MVD), for the building design space to eliminate the need to build tools for various formats. An embodiment of the present disclosure also provides reconfigurable building information exchange and formats, and template-based mapping for enhanced user interface.

Briefly, building information modeling (BIM) refers to a process of creating and managing digital or electronic representations of corresponding physical facilities or buildings. The BIM models are typically computer generated.

Industry Foundation Classes (IFC) is a current data model standard used in architecture design file, registered with ISO as ISO16739, and written in EXPRESS language. IFCXML is a schema of IFC in extensible markup language (XML) format (see http://buildingsmart-tech.org/ifcXML/IFC2x3/FINAL/IFC2x3.xsd).

Model View Definition (MVD) is an IFC View Definition that defines a subset of the IFC schema needed to satisfy one or many exchange requirements of the Architecture, Engineering & Construction (AEC) industry. MVD is a standard methodology and format documenting software implementation requirements for standard IFC based data exchange, adopted by the buildingSMART International in the spring of 2005. Information Delivery Manual, IDM (also ISO/DIS 29481) describes a method used and propagated by buildingSMART to define such exchange requirements (See, http://www.buildingsmart-tech.org/specifications/ifc-view-definition).

BIMserver is a building information model server (BIMserver.org). BIMserver currently supports IFC2x3 model with set of functions for querying and managing IFC elements, e.g., data model querying/merging, basic model validation, version control, basic access control via user authentication, and model translation to ifcXML, CoBIE, CityGML, Collada, and KML.

Figure 1:
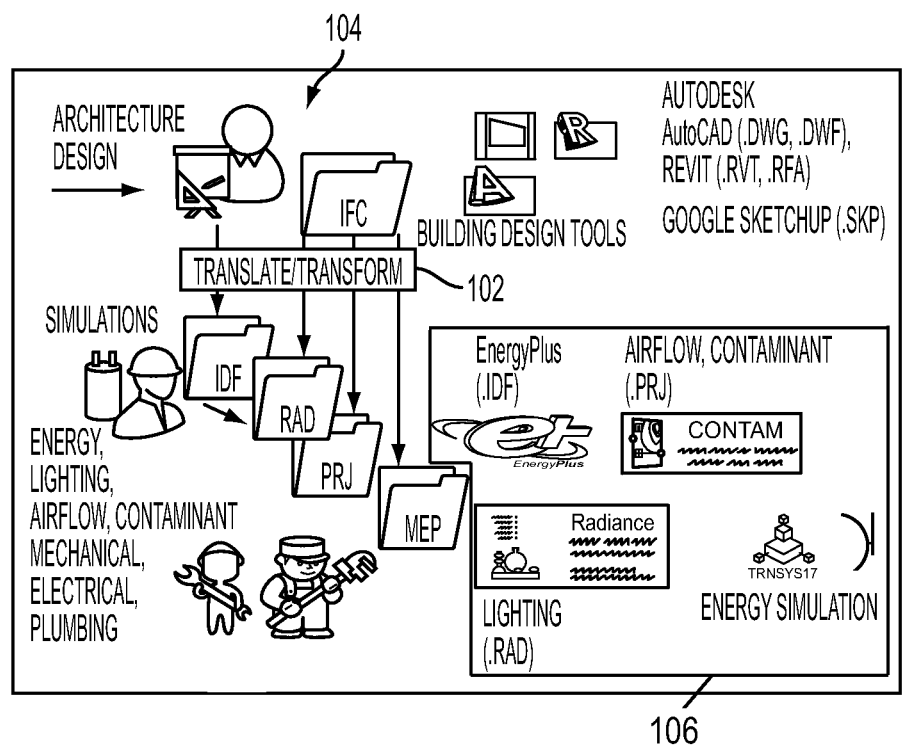
FIG. 1 illustrates an interoperability format translation and transformation of the present disclosure in one embodiment.

FIG. 1 illustrates an interoperability format translation and transformation of the present disclosure in one embodiment that enables a holistic and seamless workflow integration across a BIM life cycle, i.e., design, simulation, operations, and others, and files used by each of the phases of the BIM life cycle by, e.g., translating and transforming between IFC architectural design file and simulation file formats. In one aspect, a translate/transform module 102 of the present disclosure in one embodiment translates and transforms files in design architecture form (e.g., 104) to one or more forms used by various simulation tools (e.g., 106). The module 102 may be integrated or invoked via a BIM enablement platform, e.g., described in co-owned and co-pending U.S. patent application Ser. No. 13/648,785 entitled "Building Information Management (BIM) Enablement Platform Of BIM Data Model, Data Management Services APIs, Restful APIs for BIM Content and Metadata Hosting, Format Exchange, and Workflow Enablement," filed on even date, which is incorporated herein by reference in its entirety.

The translate/transform functionality or module 102 in one embodiment of the present disclosure is presented that may extract data, metadata and context from a set of selected IFC elements of input files to create interoperability data objects. In one embodiment, this selection and data extraction process outputs only the necessary data, metadata and context to conserve both resources and processing time. The methodology of the present disclosure in one embodiment also prepares a model translation procedure to identify the mapping from the Model View Definition to create the translation and transformation functions. Data is translated and transformed by executing the translating and transforming functions using data stored in the interoperability data objects and Model View Definition Templates to perform template-based data conversion to the correct geometric values. Desired output is produced in the target simulation file format (e.g., .IDF, .RAD). Table 1 shows example source and target formats in format translation of the present disclosure in one embodiment.

TABLE 1

| Source Format | Translation interfaces/ Standard | Target Format |
| --- | --- | --- |
| IFC/IFCXML (Autodesk AutoCAD ™) | Interoperability Data Objects + Model View Definition Template (MVDTemplate) | IDF (EnergyPlus) |
| IFC/IFCXML (Autodesk AutoCAD ™) | Interoperability Data Objects + Model View Definition Template (MVDTemplate) | RAD (Radiance) |

Figure 2:
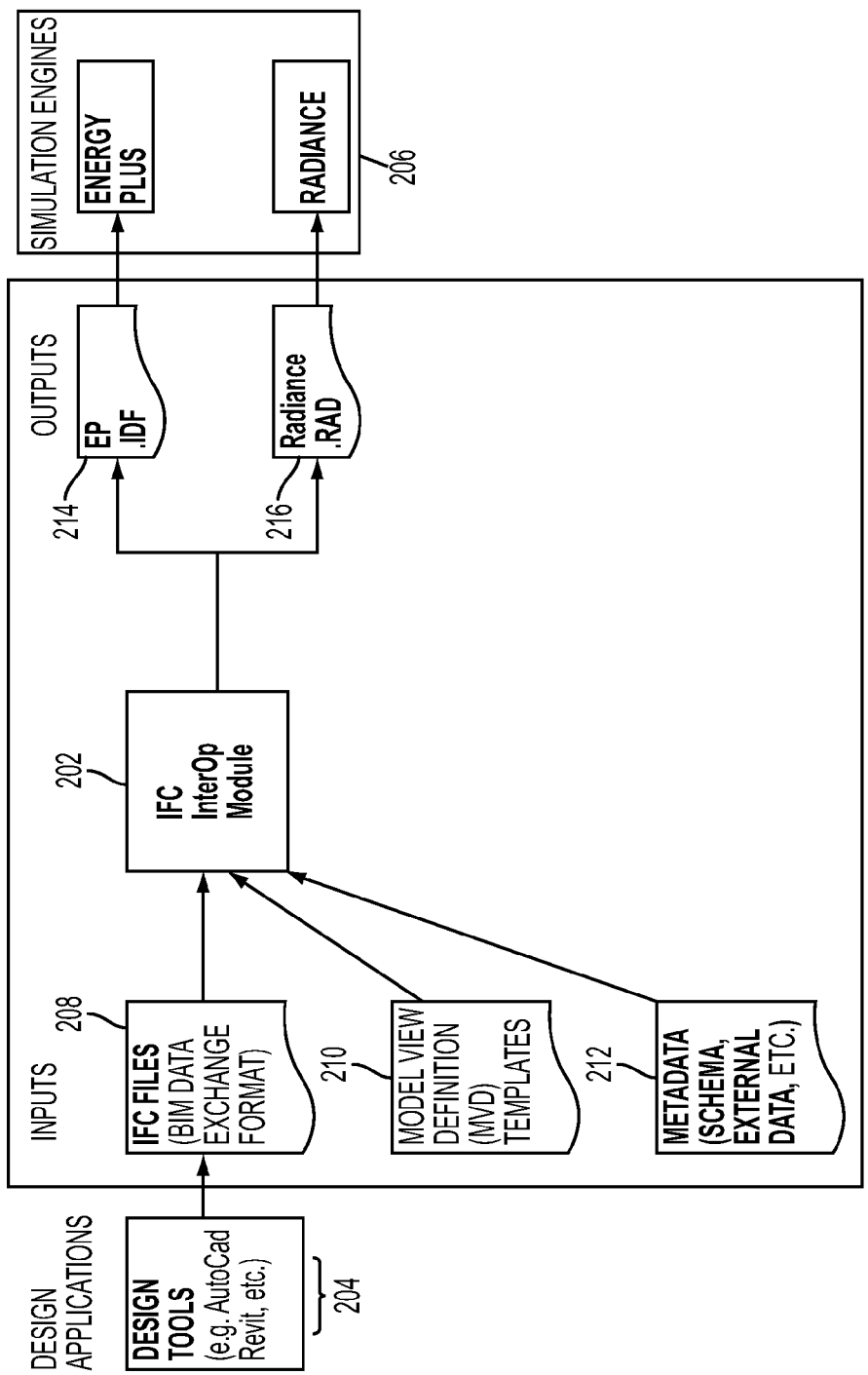
FIG. 2 illustrates a high-level functional flow for file format translation in one embodiment of the present disclosure.

FIG. 2 illustrates a high-level functional flow for file format translation in one embodiment of the present disclosure. An IFC InterOp module 202 enables interoperability between architectural design files 204 and simulation files used by simulation engines 206. Examples of simulation files used by simulation engines as shown at 206 may include an energy simulation file in .IDF file format 214 used by EnergyPlus, a lighting simulation file in .RAD file format 216 used by Radiance. The IFC InterOp module 202 in one embodiment of the present disclosure takes the architectural design files as input, e.g., one or more IFC files/IFCXML files 208, extracts data and metadata from the files 208 and stores them in interoperability data objects of the present disclosure, uses the data values of the interoperability data objects with one or more Model View Definition Templates (MVDTemplate) 210, and additional metadata 212, e.g. schemas, building material characteristics, external conditions, etc., to create translation and transformation functions. The translation and transformation functions are invoked to generate output files, e.g., 214, 216, in the appropriate simulation tool format, e.g., in .IDF file format for EnergyPlus and/or .RAD file format for Radiance.

Figure 3:
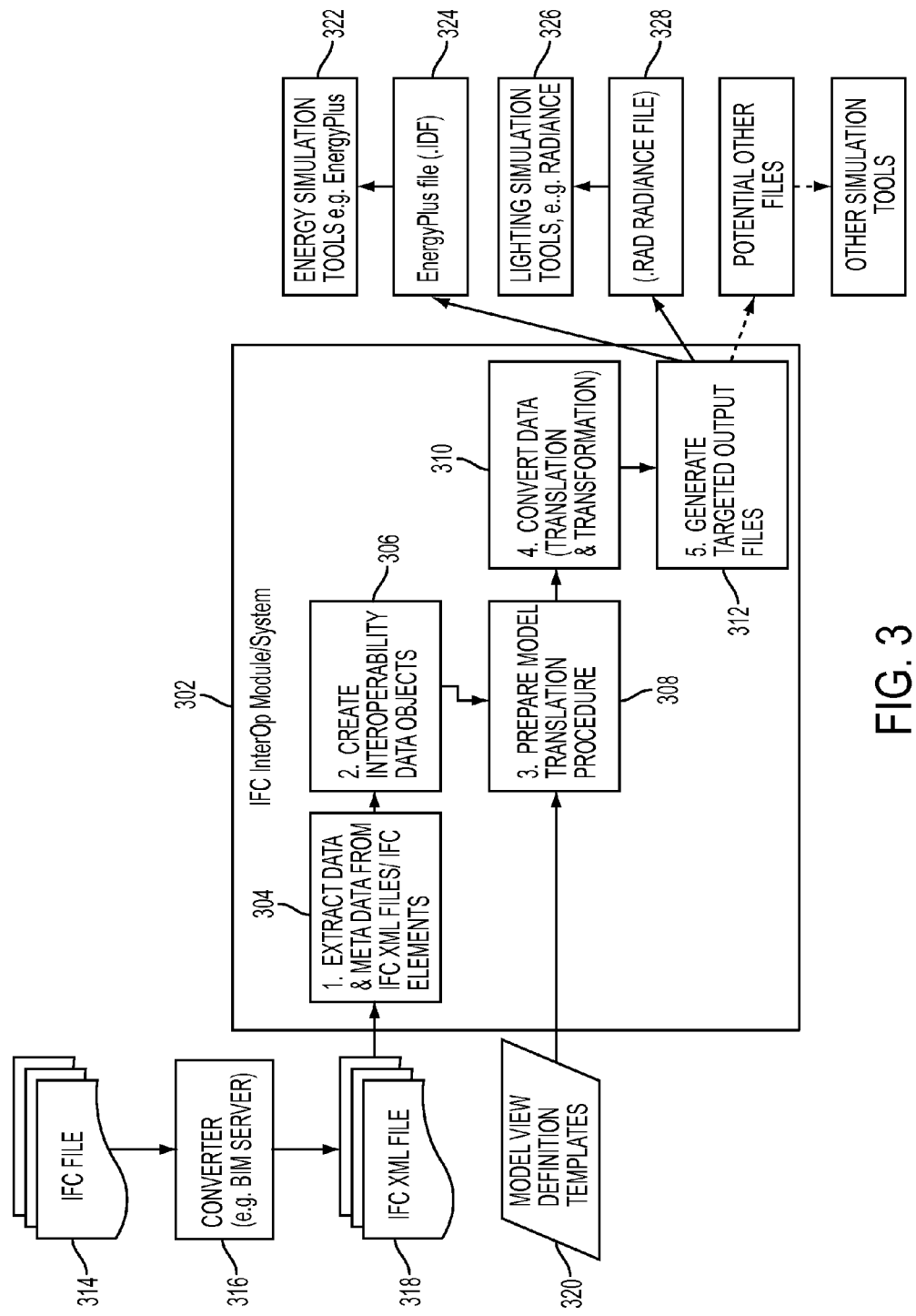
FIG. 3 illustrates functionalities of an interoperability module in one embodiment of the present disclosure.

FIG. 3 illustrates functionalities (also referred to as modules) of the IFC InterOP module 302 in one embodiment of the present disclosure. An IFC XML data extraction module 304 in one embodiment extracts data (e.g., geometric data, the metadata, and context data) from the input IFC XML files 318, e.g., converted from IFC files by a converter 316, e.g., BIM server, parses the one or more files (e.g., 318) to extract a "selected subset" of the IFC elements and their geometric data values needed for simulation, e.g., energy simulation (IDF file type) 324 for energy simulation tool, e.g., EnergyPlus 322, lighting simulation (e.g., RAD file type) 328 for lighting simulation tool, e.g., Radiance 326, and/or others. In another embodiment of the present disclosure, the data extraction module 304 receives input 318 in IFC element format. These input formats may be obtained via known or will be known converter 316 that employs one or more methodologies to convert an IFC file 314 to an IFCXML file 318 or by invoking an IFC data element APIs of an IFC file server 316 to retrieve IFC elements. Once the input is in the proper format, e.g., IFC XML file or IFC element, the IFC InterOP module 302 of the present disclosure starts its processing. The data extraction function of the present disclosure 304 extracts the geometry data, metadata, and contexts that are needed to run the selected simulation. The necessary data is defined by machine readable MVDTemplate for each data translation/transformation. The MVDTemplates are read by computer programs to select necessary data objects, which are then translated/transformed to appropriate data formats.

An interoperability data object creation module 306 in one embodiment may store the data values parsed and extracted by the data extraction module 304 in an intermediate data structures referred to as interoperability data objects in the present disclosure. The interoperability data objects of the present disclosure in one embodiment contain or hold geometric data values, the metadata, and context data from the design tool files, e.g., IFC XML files. The data contained in the interoperability data objects are used for data conversion by a convert (translation/transformation) data module 310.

A model translation preparation module 308 in one embodiment may use a standard Model View Definition (MVD) for format translation. The model translation preparation module 308 in one embodiment identifies the necessary mapping from a MVD to format translation and transformation functions. For instance, the model translation preparation module 308 uses a Model View Definition Template (MVDTemplate) 320 to create translation function definitions; and fills in the translation functions with data, e.g., by invoking APIs provided by the interoperability data object creation module 306. The template can be used by third-party vendors to translate into other output formats as needed.

Base standards for MVD define a subset of the IFC schema that satisfies one or more data exchange requirements (http://buildingsmart.com/standards/mvd). MVDTemplate of the present disclosure in one embodiment defines an exemplar set of required data needed for format translation and transformation using an MVD instance. MVDTemplates may be extended or refined according to desired implementation and data schema.

A data conversion (translation/transformation) module 310 in one embodiment converts the data to the geometric value using the format translation and transformation functions based on the offset, clipping, rotation, etc., to properly represent the placement on an energy simulation model file. A file generation module 312 in one embodiment takes input from both the interoperability data objects and MVDTemplates 320.

This file generation module 312 in one embodiment generates the appropriate simulation file format based on the data converted and grouped together, e.g., for geometric viewing purpose by the data conversion module 310.

Figure 4:
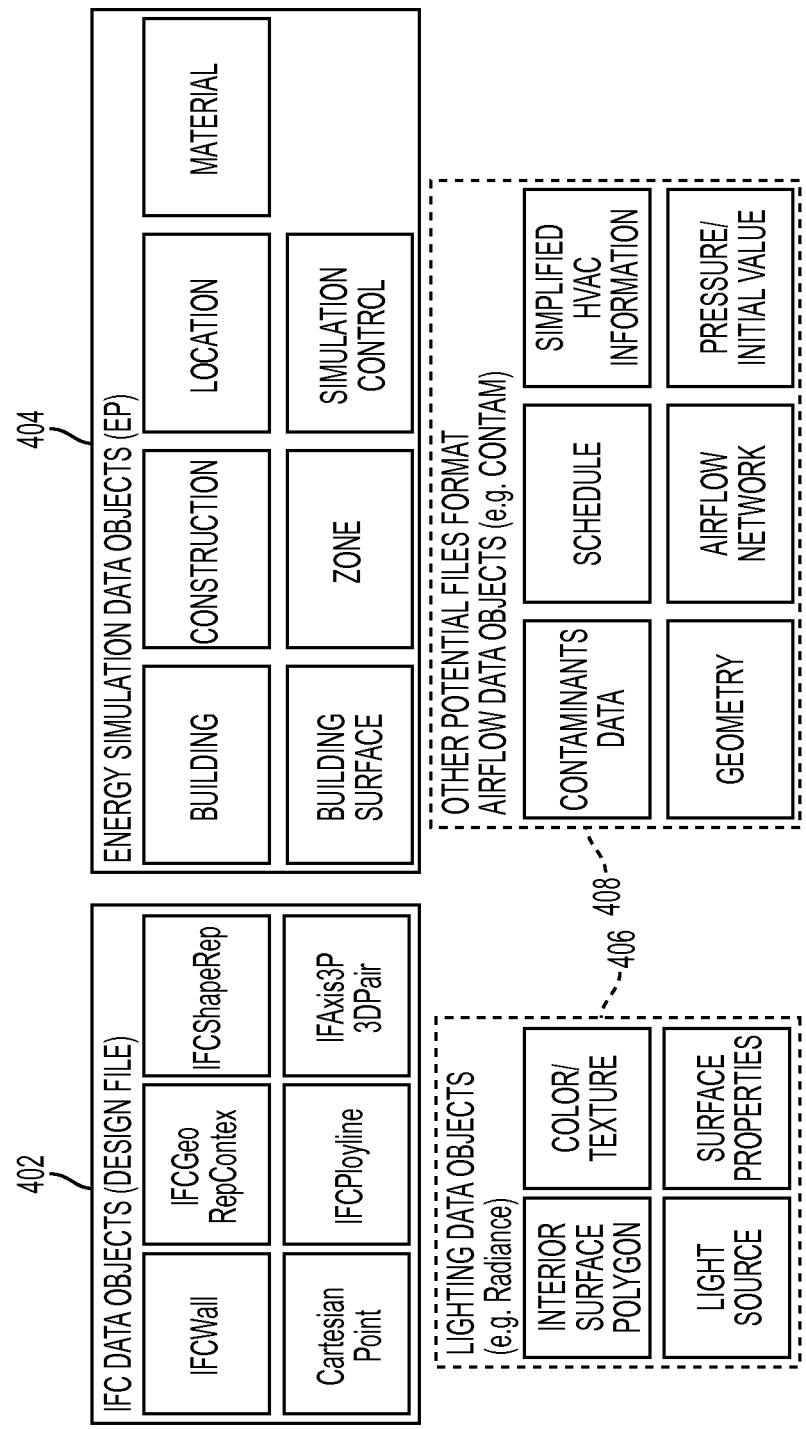
FIG. 4 shows a set of sample interoperability data objects and their usage in one embodiment of the present disclosure.

FIG. 4 shows a set of sample interoperability data objects and their usage in one embodiment of the present disclosure. The interoperability data objects 402, 404, 406, 408 store intermediate data extracted from selected elements of the IFC and/or IFC XML files to create simulation related output files for energy simulation, lighting simulation, and others. For example, the interoperability data objects 402 store data describing the physical characteristics of a building, e.g., data representing a wall and its related sub components, e.g., building geometry such as shapes, polylines, Cartesian points, and their contexts.

Energy simulation data objects 404 in one embodiment of the present disclosure store data needed to create energy simulation output files, e.g., building, building surface, construction, location, material, zone, simulation control, etc. These objects in one embodiment are used to create EnergyPlus (EP) .IDF file as a sample implementation. The data to be stored in the energy simulation data objects 404 are extracted from selected elements of the IFC and/or IFC XML files in one embodiment of the present disclosure.

Lighting data objects 406 in one embodiment store data needed to create lighting simulation output files, e.g., interior surface polygon, light source, color/texture, surface properties, etc. These objects can be used to create Radiance .RAD file. The data to be stored in the lighting data objects 406 are extracted from selected elements of the IFC and/or IFC XML files in one embodiment of the present disclosure.

Airflow data objects 408 in one embodiment of the present disclosure store data needed to create airflow simulation output files, e.g., contaminants data, simplified HVAC information, airflow network, pressure/initial value, schedule, geometry, etc. These objects can be used to create CONTAM file (.PRJ). The data to be stored in the airflow data objects 408 are extracted from selected elements of the IFC and/or IFC XML files in one embodiment of the present disclosure.

Figure 5:
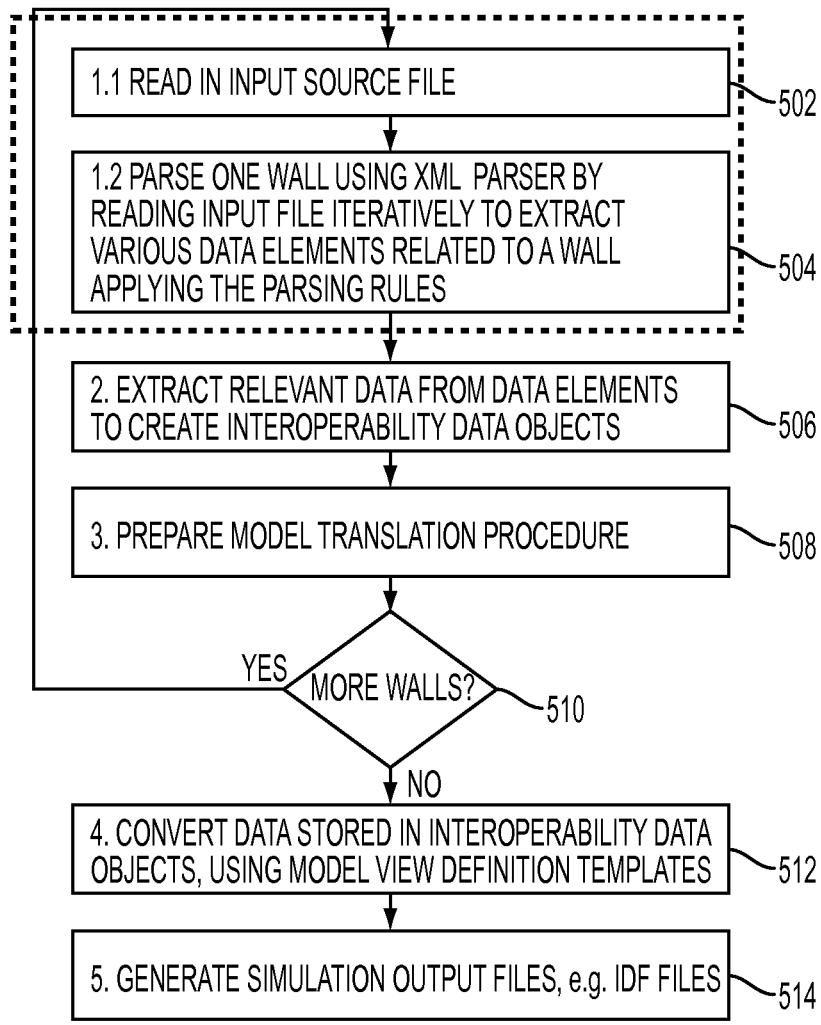
FIG. 5 is a high-level flow diagram illustrating a method of format translation/transformation in one embodiment of the present disclosure.

FIG. 5 is a high-level flow diagram illustrating a method of format transformation in one embodiment of the present disclosure. Items 502 and 504 illustrate one way of obtaining IFC elements, e.g., Cartesian points of a line, of a polygon, etc. However, it should be understood that the methodologies of the present disclosure are not limited to only those ways. Other input mechanisms may be utilized to obtain such data. At 502, input source files are read. For instance, architecture file in IFC XML format may be read. In one embodiment of the present disclosure, if the files are in IFC format, they may be first transformed using existing tools to IFC XML file format before using as input in this methodology in one embodiment.

At 504, for each wall in the input file, parse one wall at a time by reading the input file iteratively and extracting various data elements related to a wall using an XML parser (e.g., Simple API for XML (SAX) parser) and applying the parsing rules. The parsing rules are defined in an MVDTemplate as a sequential procedure to identify, link, and translate IFC elements. The parsing may start out with an element that represents the wall element and then iteratively parsing sub-elements pointed to by this enclosing wall element via identifiers (IDs), which are unique identification numbers of IFC elements. In one aspect, the parsing rules may deal with large building design files, e.g., in IFC XML format, and handle the way the elements are read in reversed order, where the enclosing element read in after the enclosed elements. In one embodiment of the present disclosure, recursive elements searching methods may be utilized.

At 506, as each relevant element is encountered during the parsing, data from the relevant element is extracted and corresponding one or more interoperability data objects are filled in with the data.

At 508, a model translation procedure is prepared to identify a mapping from a Model View Definition (MVD) to one or more translation and transformation functions. For example, the mapping(s) could be one or more function calls that read and translate IFC data to IDF data (for EnergyPlus energy simulation tool). The preparation at 508 includes using the MVDTemplate to create translation function definitions, and filling in the translation functions with data from the interoperability data objects that correspond to the definitions in the MVDTemplate. In one embodiment, the translation functions may be filled in with data, e.g., by invoking data query APIs of the interoperability data objects or similar services.

The processing shown in 502, 504, 506 and 508 are repeated for all walls. Thus, at 510, if there are more walls to process, then the logic returns to 502. If all walls have been processed, at 512, the data stored in interoperability data objects is converted using the MVDTemplate. The conversion function takes various data from IFC and generates pre-defined data by mapping IFC data.

At 514, simulation output files are generated. The conversion functions create files using standard file input/output methods.

Figure 6:
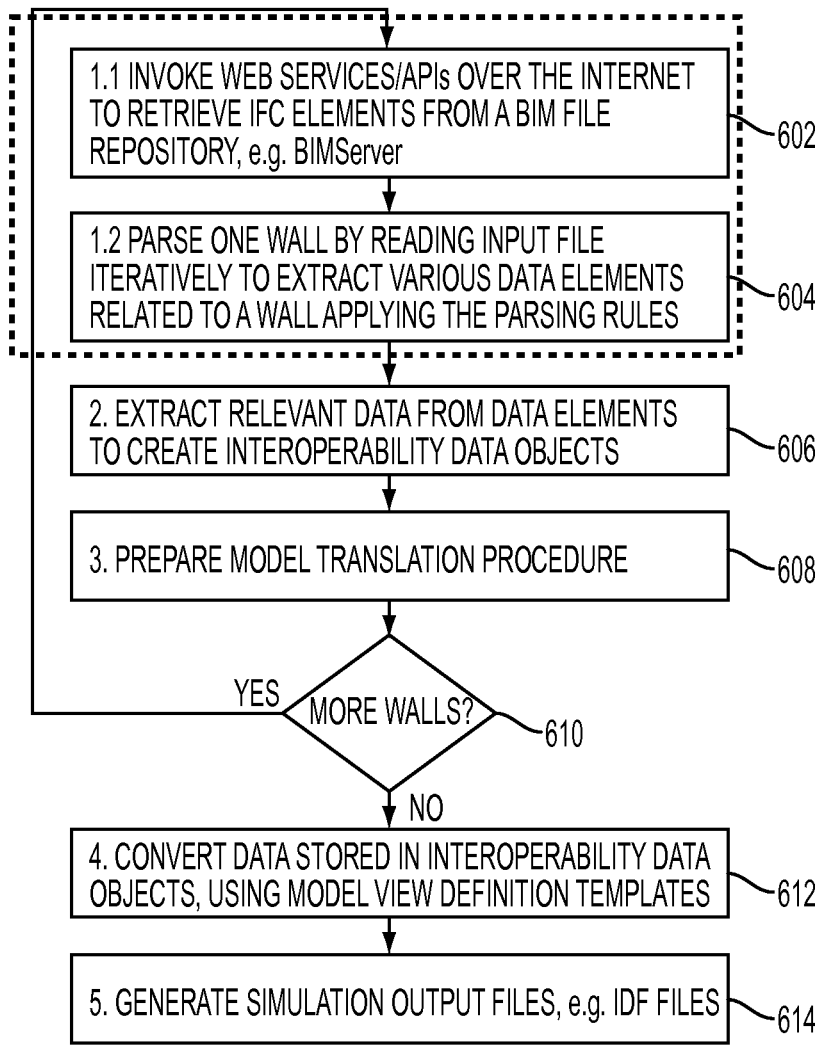
FIG. 6 is a high-level flow diagram illustrating a method of format translation/transformation in another embodiment of the present disclosure.

FIG. 6 is a high-level flow diagram illustrating a method of format transformation in another embodiment of the present disclosure. The processing at 602 and 604 shows in one embodiment a mechanism for obtaining data values from a building design IFC elements instead of from an IFC/IFX XML file as shown in FIG. 5. For example, at 602, IFC elements may be retrieved from a BIM file repository server, e.g., BIMServer, by invoking one or more Web services and/or APIs over the Internet. At 604, an IFC element, e.g. wall element, may be parsed, e.g., iteratively for one wall element at a time, to extract data elements related to the wall, by applying the appropriate parsing rules. Steps 602, 604, or 602/604 can be chosen based on an input data format. At 606, relevant data defined by an MVDTemplate from the extracted data elements are further extracted to create interoperability data objects.

At 608, a model translation procedure is prepared to identify a mapping from a Model View Definition (MVD) to one or more translation and transformation functions. The preparation at 608 in one embodiment includes using the MVDTemplate to create translation function definitions, and filling in the translation functions with data from the interoperability data objects that correspond to the definitions is the MVDTemplate.

The processing shown in 602, 604, 606 and 608 are repeated for all walls. Thus, at 610, if there are more walls to process, then the logic returns to 602. If all walls have been processed, at 612, the data stored in interoperability is converted using the MVDTemplate.

At 614, simulation output files such as IDF files are generated.

Figure 7:
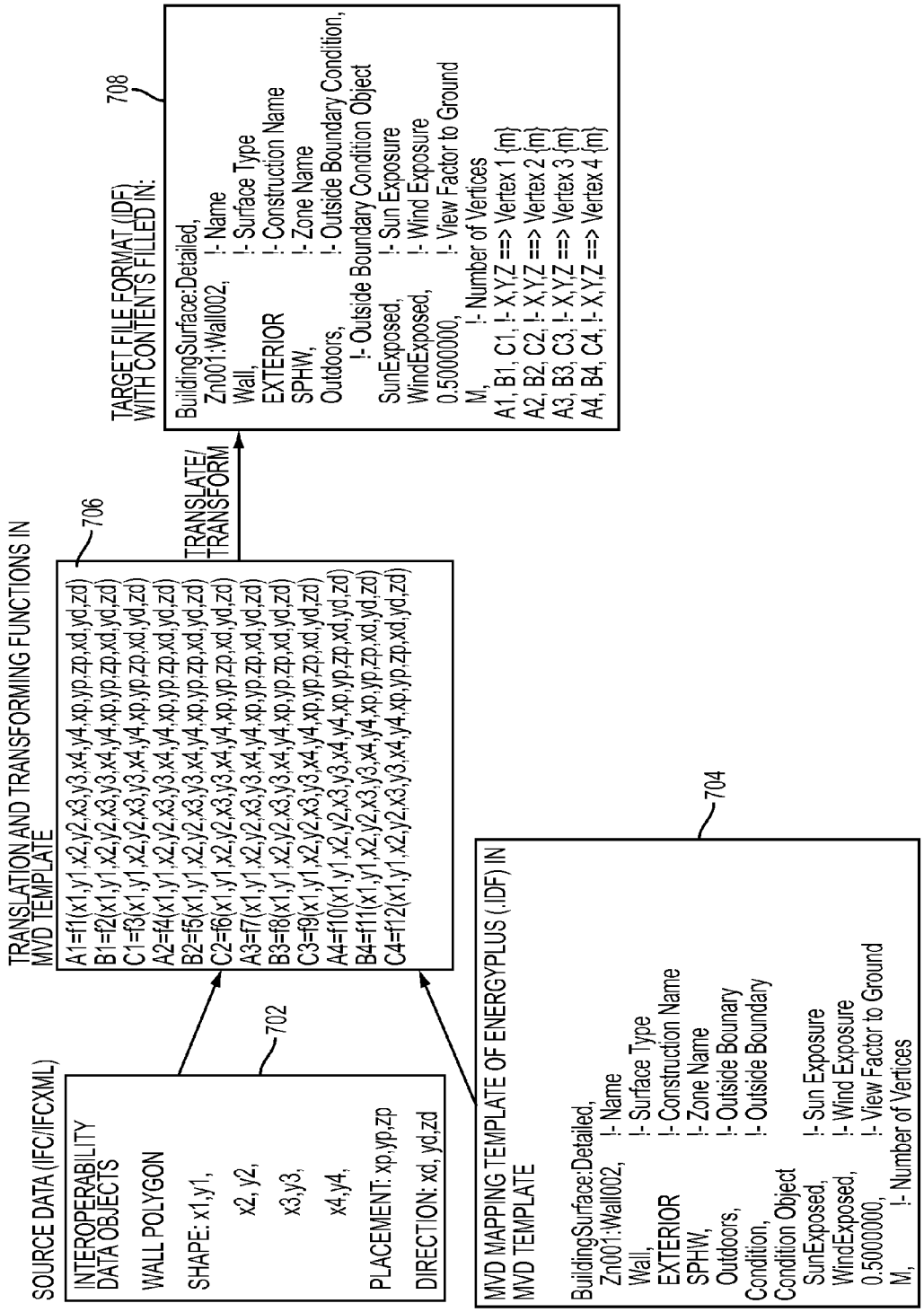
FIG. 7 is a diagram illustrating preparation of a model translation procedure in one embodiment of the present disclosure.

FIG. 7 is a diagram illustrating preparation of a format translation and transformation procedure, e.g., shown in FIGS. 5 (508) and 6 (608), that identifies the mapping from the Model View Definition (MVD) to the translation and transformation functions, convert data, and generate target output files, in one embodiment of the present disclosure. Inputs to the method may comprise data extracted and stored in interoperability data objects 702, and a Model View Definition Template (MVDTemplate) instance that defines, among other things, the MVD mapping template of a specific simulation tool, e.g., EnergyPlus 704, e.g., and format translation and transformation function template, both in XML format, without data values. The interoperability data objects 702 are populated with data extracted from a source file (e.g., in IFC/IFCXML format) as described above. As an example, this diagram shows a MVD mapping template of EnergyPlus (IDF format) in an MVDTemplate instance 704 as input.

The MVD mapping template of a specific tool in MVDTemplate 704 is used to create translation and transformation function definition templates. For example, the translation and transformation function template in MVDTemplate 706, reusable for one or more simulation tools, e.g., EnergyPlus and Radiance, etc., are filled in with the data in the interoperability data objects 702, e.g., by invoking one or more interoperability data objects query APIs. The MVD mapping template of a specific tool in MVDTemplate 704 requires domain knowledge to define by selecting certain required elements from the entire set of elements as defined by the tool, e.g., EnergyPlus, based on the standard MVD. Further, translation and transformation function template 706 is adaptable to changes. In case of any future changes in geometric representations by IFC, only a single set of the translation and transformation function template 706 need to be modified to adapt to new changes and can then be used again for multiple simulation tools.

A translation function (1) takes geometry, material properties, and other related data 702, (2) transforms and translates the data with pre-defined rules generated using MVDTemplate 704, (3) produces geometric data needed in a format that a said tool can use as an input. The output from a set of translation functions are combined to create an executable simulation input to a tool, e.g., EnergyPlus for energy simulation.

The geometric data values, e.g., Cartesian points etc., needed in the output file 708 is produced by running the translation and transformation functions 706 to produce the converted data. That is, an output file 708, which is compatible to use with one or more building simulation tools, is generated, e.g., by running the translation and transformation functions 706 using the extracted data 702 and the template to fill in the Model View Definition Template instance 704. In one embodiment of the present disclosure, converted data is data in memory (not necessary in the right data format that can be consumed by a simulation tool), and output file is consumable data by a simulation tool.

Table 2 shows examples of Interoperability Data Objects Query APIs

| | |
|---|---|
| public List getAllWalls( ); | Given an IFC/IFC XML file, list all walls found in the file |
| public IFCWall getWallbyId(String id); | Return an IFCWall interoperability data object using the unique IFC element identifier of the wall element. // IFCWall APIs |
| public IFCShapeRep getShapeRepElem( ); | Get an IFCShapeRep interoperability data object from an IFCWall element. |
| public IFCGeoRepContext getGeoRepContextElem( ); | Get IFCGeoRepContext interoperability data object from an IFCWall element. |
| public getPolylineByWallId(String id); | Get polyline interoperability data objects for the IFC Wall element specified as in the element id. |

Figure 8:
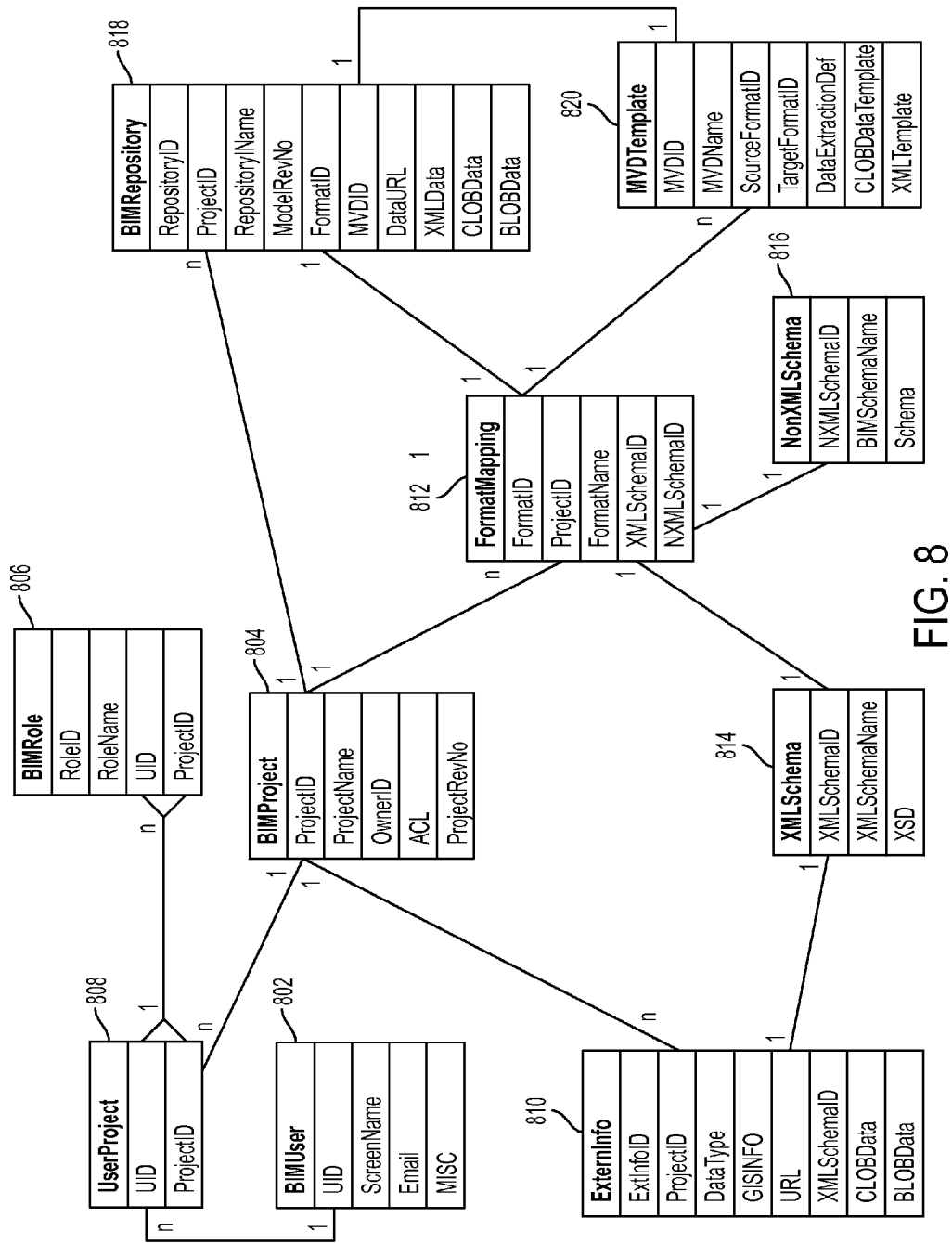
FIG. 8 is a data model showing Model View Definition templates (MVDTemplate) in one embodiment of the present disclosure.

FIG. 8 is a data model showing Model View Definition Templates (MVDTemplate) in one embodiment of the present disclosure. In the MVDTemplate schema definition 820, the 'XML Template' field comprises the MVD mapping template of a tool, e.g., EnergyPlus (.IDF) shown in FIG. 7 at 702, and the translation and transforming function template shown in FIG. 7 at 706. An MVDTemplate schema definition 820 is shown with its relationship with other data elements in the data model, directly (BIMRespository 818, FormatMapping 812) and indirectly (816, 814, 804, 810, 808, 802, 806). The MVDTemplate data entity 820 stores a pointer to an instance of Model View Definition and all data related to the MVD instance needed for format translation/transformation, which also includes the format schema information stored in FormatMapping 812 and the files/data stored in the BIMRepository 818.

The following illustrates examples of a source IFC XML testing file and the corresponding output file, for instance, used and generated according to FIG. 5, or FIG. 6. They show an example output as a result of the parsing and creating a set of IFC interoperability data objects for use by the translation/formation functions in one embodiment of the present disclosure. The below example shows parsing of 7 walls: two completely parsed Basic walls (first wall Id: "i132903"; second wall Id: "i133141") in its entirety plus 5 more walls with only the top level element of <IfcWallStandardCase>: i133088", "i133201", "i133262", "i133342", and "i57108".

Extracted Output of Wall ID "i132903"—
GeometricRepresentationContext ref:i132529
representationId:Axis
representationType:Curve2D
itemType:IfcPolyline, reference:i132851
Polyline CP are 2:
CartesianPoint: id=i132497, CP count=2, x=0.0. y=0.0, z=0.0
CartesianPoint: id=i132850, CP count=2, x=61.625. y=-0.0, z=0.0
GeometricRepresentationContextType:Model
coordSpaceDim:3
precison:1.0E-9
worldCoordSystemRef:i132528

Another example translation function is for an air-flow simulation using CONTAM. The translation function takes a set of enclosing wall elements to create a zone for air flow in FIG. 7 at 702. The said translation function uses Cartesian coordinates from the extracted walls to create a 2-dimensional zone boundary. For example, after parsing geometry data from <IfcWallStandardCase> elements that are extracted in the interoperability objects in FIG. 7 at 702, the translation function (similar to 706 in FIG. 7) uses a set of geometry data to calculate projected 2-dimensional view of a room. The calculated edge points of the projected room then are expressed in 2-dimensional Cartesian points, which then may be converted to a zone definition in CONTAM data model. A leak entry in CONTAM model can also be extracted from various building elements described in IFC components such as fenestration surfaces and open vents. The translation function takes the size of the said components, calculates the leak coefficient of each component, and generates input data for CONTAM simulation.

Table 3 shows contents of an example input IFC XML file, e.g., shown at 318.

Table 3

```xml
<?xml version="1.0" encoding="UTF-8" ?>
- <iso_10303_28 version="2.0" xmlns:xsi="http://www.w3.org/2001/XMLSchema-instance" xmlns:xlink="http://www.w3.org/1999/xlink"
xmlns="urn:iso.org:standard:10303:part(28):version(2):xmlschema:common"
xsi:schemaLocation="urn:iso.org:standard:10303:part(28):version(2):xmlschema:common http://www.iai-tech.org/ifcXML/IFC2x3/FINAL/ex.xsd">
- <uos id="uos_1" description="" configuration="i-ifc2x3" edo=""
xmlns="http://www.iai-tech.org/ifcXML/IFC2x3/FINAL"
xmlns:ex="urn:iso.org:standard:10303:part(28):version(2):xmlschema:common"
xsi:schemaLocation="http://www.iai-tech.org/ifcXML/IFC2x3/FINAL
http://www.iai-tech.org/ifcXML/IFC2x3/FINAL/IFC2X3.xsd">
- <IfcCartesianPoint id="i132496">
- <Coordinates ex:cType="list">
  <IfcLengthMeasure>0.0</IfcLengthMeasure>
  <IfcLengthMeasure>0.0</IfcLengthMeasure>
  <IfcLengthMeasure>0.0</IfcLengthMeasure>
  </Coordinates>
  </IfcCartesianPoint>
- <IfcCartesianPoint id="i132497">
- <Coordinates ex:cType="list">
  <IfcLengthMeasure>0.0</IfcLengthMeasure>
  <IfcLengthMeasure>0.0</IfcLengthMeasure>
  </Coordinates>
  </IfcCartesianPoint>
- <IfcDirection id="i132499">
- <DirectionRatios ex:cType="list">
  <ex:double-wrapper>-1.0</ex:double-wrapper>
  <ex:double-wrapper>0.0</ex:double-wrapper>
  <ex:double-wrapper>0.0</ex:double-wrapper>
```

```xml
    </DirectionRatios>
  </IfcDirection>
  <IfcDirection id="i132500">
    <DirectionRatios ex:cType="list">
      <ex:double-wrapper>0.0</ex:double-wrapper>
      <ex:double-wrapper>1.0</ex:double-wrapper>
      <ex:double-wrapper>0.0</ex:double-wrapper>
    </DirectionRatios>
  </IfcDirection>
  <IfcDirection id="i132501">
    <DirectionRatios ex:cType="list">
      <ex:double-wrapper>0.0</ex:double-wrapper>
      <ex:double-wrapper>-1.0</ex:double-wrapper>
      <ex:double-wrapper>0.0</ex:double-wrapper>
    </DirectionRatios>
  </IfcDirection>
  <IfcDirection id="i132502">
    <DirectionRatios ex:cType="list">
      <ex:double-wrapper>0.0</ex:double-wrapper>
      <ex:double-wrapper>0.0</ex:double-wrapper>
      <ex:double-wrapper>1.0</ex:double-wrapper>
    </DirectionRatios>
  </IfcDirection>
  <IfcAxis2Placement3D id="i132526">
    <Location>
      <IfcCartesianPoint xsi:nil="true" ref="i132496" />
    </Location>
  </IfcAxis2Placement3D>
  <IfcLocalPlacement id="i132527">
    <PlacementRelTo>
      <IfcLocalPlacement xsi:nil="true" ref="i135103" />
    </PlacementRelTo>
```

```xml
 -<RelativePlacement>
   <IfcAxis2Placement3D xsi:nil="true" ref="i132526" />
  </RelativePlacement>
  </IfcLocalPlacement>
 -<IfcAxis2Placement3D id="i132528">
 -<Location>
   <IfcCartesianPoint xsi:nil="true" ref="i132496" />
  </Location>
  </IfcAxis2Placement3D>
 -<IfcGeometricRepresentationContext id="i132529">
   <ContextType>Model</ContextType>
   <CoordinateSpaceDimension>3</CoordinateSpaceDimension>
   <Precision>1.0E-9</Precision>
 -<WorldCoordinateSystem>
   <IfcAxis2Placement3D xsi:nil="true" ref="i132528" />
  </WorldCoordinateSystem>
  </IfcGeometricRepresentationContext>
 -<IfcAxis2Placement3D id="i132539">
 -<Location>
   <IfcCartesianPoint xsi:nil="true" ref="i132496" />
  </Location>
  </IfcAxis2Placement3D>
 -<IfcDirection id="i132499">
 -<DirectionRatios ex:cType="list">
   <ex:double-wrapper>-1.0</ex:double-wrapper>
   <ex:double-wrapper>0.0</ex:double-wrapper>
   <ex:double-wrapper>0.0</ex:double-wrapper>
  </DirectionRatios>
  </IfcDirection>
 -<IfcAxis2Placement3D id="i132539">
 -<Location>
   <IfcCartesianPoint xsi:nil="true" ref="i132496" />
```

```xml
      </Location>
    </IfcAxis2Placement3D>
    <IfcLocalPlacement id="i132540">
      <PlacementRelTo>
        <IfcLocalPlacement xsi:nil="true" ref="i132527" />
      </PlacementRelTo>
      <RelativePlacement>
        <IfcAxis2Placement3D xsi:nil="true" ref="i132539" />
      </RelativePlacement>
    </IfcLocalPlacement>
    <IfcCartesianPoint id="i132847">
      <Coordinates ex:cType="list">
        <IfcLengthMeasure>-43.47796</IfcLengthMeasure>
        <IfcLengthMeasure>20.89203</IfcLengthMeasure>
        <IfcLengthMeasure>0.0</IfcLengthMeasure>
      </Coordinates>
    </IfcCartesianPoint>
    <IfcAxis2Placement3D id="i132848">
      <Location>
        <IfcCartesianPoint xsi:nil="true" ref="i132847" />
      </Location>
    </IfcAxis2Placement3D>
    <IfcLocalPlacement id="i132849">
      <PlacementRelTo>
        <IfcLocalPlacement xsi:nil="true" ref="i132540" />
      </PlacementRelTo>
      <RelativePlacement>
        <IfcAxis2Placement3D xsi:nil="true" ref="i132848" />
      </RelativePlacement>
    </IfcLocalPlacement>
    <IfcCartesianPoint id="i132850">
      <Coordinates ex:cType="list">
```

```xml
<IfcLengthMeasure>61.625</IfcLengthMeasure>
<IfcLengthMeasure>-0.0</IfcLengthMeasure>
</Coordinates>
</IfcCartesianPoint>
<IfcPolyline id="i132851">
<Points ex:cType="list">
<IfcCartesianPoint pos="0" xsi:nil="true" ref="i132497" />
<IfcCartesianPoint pos="1" xsi:nil="true" ref="i132850" />
</Points>
</IfcPolyline>
<IfcShapeRepresentation id="i132852">
<ContextOfItems>
<IfcGeometricRepresentationContext xsi:nil="true" ref="i132529" />
</ContextOfItems>
<RepresentationIdentifier>Axis</RepresentationIdentifier>
<RepresentationType>Curve2D</RepresentationType>
<Items ex:cType="set">
<IfcPolyline pos="0" xsi:nil="true" ref="i132851" />
</Items>
</IfcShapeRepresentation>
<IfcPolyline id="i132892">
<Points ex:cType="list">
<IfcCartesianPoint pos="0" xsi:nil="true" ref="i132497" />
<IfcCartesianPoint pos="1" xsi:nil="true" ref="i132885" />
<IfcCartesianPoint pos="2" xsi:nil="true" ref="i132886" />
<IfcCartesianPoint pos="3" xsi:nil="true" ref="i132887" />
<IfcCartesianPoint pos="4" xsi:nil="true" ref="i132888" />
<IfcCartesianPoint pos="5" xsi:nil="true" ref="i132889" />
<IfcCartesianPoint pos="6" xsi:nil="true" ref="i132890" />
<IfcCartesianPoint pos="7" xsi:nil="true" ref="i132891" />
<IfcCartesianPoint pos="8" xsi:nil="true" ref="i132497" />
</Points>
```

```xml
</IfcPolyline>
<IfcCartesianPoint id="i132893">
  <Coordinates ex:cType="list">
    <IfcLengthMeasure>1.625</IfcLengthMeasure>
    <IfcLengthMeasure>-0.8125</IfcLengthMeasure>
    <IfcLengthMeasure>11.21875</IfcLengthMeasure>
  </Coordinates>
</IfcCartesianPoint>
<IfcDirection id="i132894">
  <DirectionRatios ex:cType="list">
    <ex:double-wrapper>0.0</ex:double-wrapper>
    <ex:double-wrapper>0.6</ex:double-wrapper>
    <ex:double-wrapper>0.8</ex:double-wrapper>
  </DirectionRatios>
</IfcDirection>
<IfcAxis2Placement3D id="i132895">
  <Location>
    <IfcCartesianPoint xsi:nil="true" ref="i132893" />
  </Location>
  <Axis>
    <IfcDirection xsi:nil="true" ref="i132894" />
  </Axis>
  <RefDirection>
    <IfcDirection xsi:nil="true" ref="i132499" />
  </RefDirection>
</IfcAxis2Placement3D>
<IfcPlane id="i132896">
  <Position>
    <IfcAxis2Placement3D xsi:nil="true" ref="i132895" />
  </Position>
</IfcPlane>
<IfcCartesianPoint id="i132897">
```

```xml
 - <Coordinates ex:cType="list">
   <IfcLengthMeasure>1.625</IfcLengthMeasure>
   <IfcLengthMeasure>-0.8125</IfcLengthMeasure>
   <IfcLengthMeasure>11.21875</IfcLengthMeasure>
   </Coordinates>
   </IfcCartesianPoint>
 - <IfcAxis2Placement3D id="i132898">
 - <Location>
   <IfcCartesianPoint xsi:nil="true" ref="i132897" />
   </Location>
   </IfcAxis2Placement3D>
 - <IfcPolygonalBoundedHalfSpace id="i132899">
 - <BaseSurface>
   <IfcPlane xsi:nil="true" ref="i132896" />
   </BaseSurface>
   <AgreementFlag>false</AgreementFlag>
 - <Position>
   <IfcAxis2Placement3D xsi:nil="true" ref="i132898" />
   </Position>
 - <PolygonalBoundary>
   <IfcPolyline xsi:nil="true" ref="i132892" />
   </PolygonalBoundary>
   </IfcPolygonalBoundedHalfSpace>
 - <IfcBooleanClippingResult id="i132900">
   <Operator>difference</Operator>
 - <FirstOperand>
   <IfcBooleanClippingResult xsi:nil="true" ref="i132884" />
   </FirstOperand>
 - <SecondOperand>
   <IfcPolygonalBoundedHalfSpace xsi:nil="true" ref="i132899" />
   </SecondOperand>
   </IfcBooleanClippingResult>
```

```xml
- <IfcShapeRepresentation id="i132901">
 - <ContextOfItems>
   <IfcGeometricRepresentationContext xsi:nil="true" ref="i132529" />
   </ContextOfItems>
   <RepresentationIdentifier>Body</RepresentationIdentifier>
   <RepresentationType>Clipping</RepresentationType>
 - <Items ex:cType="set">
   <IfcBooleanClippingResult pos="0" xsi:nil="true" ref="i132900" />
   </Items>
   </IfcShapeRepresentation>
- <IfcProductDefinitionShape id="i132902">
 - <Representations ex:cType="list">
   <IfcShapeRepresentation pos="0" xsi:nil="true" ref="i132852" />
   <IfcShapeRepresentation pos="1" xsi:nil="true" ref="i132901" />
   </Representations>
   </IfcProductDefinitionShape>
- <IfcWallStandardCase id="i132903">
   <GlobalId>2OHDIkzebEBwa4EcxRR1xB</GlobalId>
 - <OwnerHistory>
   <IfcOwnerHistory xsi:nil="true" ref="i132535" />
   </OwnerHistory>
   <Name>Basic Wall:Exterior - Brick on CMU:157571</Name>
   <ObjectType>Basic Wall:Exterior - Brick on CMU:250</ObjectType>
 - <ObjectPlacement>
   <IfcLocalPlacement xsi:nil="true" ref="i132849" />
   </ObjectPlacement>
 - <Representation>
   <IfcProductDefinitionShape xsi:nil="true" ref="i132902" />
   </Representation>
   <Tag>157571</Tag>
   </IfcWallStandardCase>
- <IfcWallStandardCase id="i133088">
```

```xml
<GlobalId>2OHDIkzebEBwa4EcxRR1wX</GlobalId>
<OwnerHistory>
  <IfcOwnerHistory xsi:nil="true" ref="i132535" />
</OwnerHistory>
<Name>Basic Wall:Exterior - Brick on CMU:157673</Name>
<ObjectType>Basic Wall:Exterior - Brick on CMU:250</ObjectType>
<ObjectPlacement>
  <IfcLocalPlacement xsi:nil="true" ref="i133052" />
</ObjectPlacement>
<Representation>
  <IfcProductDefinitionShape xsi:nil="true" ref="i133087" />
</Representation>
<Tag>157673</Tag>
</IfcWallStandardCase>
<IfcDirection id="i132502">
  <DirectionRatios ex:cType="list">
    <ex:double-wrapper>0.0</ex:double-wrapper>
    <ex:double-wrapper>0.0</ex:double-wrapper>
    <ex:double-wrapper>1.0</ex:double-wrapper>
  </DirectionRatios>
</IfcDirection>
<IfcCartesianPoint id="i133110">
  <Coordinates ex:cType="list">
    <IfcLengthMeasure>16.52204</IfcLengthMeasure>
    <IfcLengthMeasure>0.89203084</IfcLengthMeasure>
    <IfcLengthMeasure>0.0</IfcLengthMeasure>
  </Coordinates>
</IfcCartesianPoint>
<IfcAxis2Placement3D id="i133111">
<Location>
  <IfcCartesianPoint xsi:nil="true" ref="i133110" />
</Location>
```

```xml
- <Axis>
    <IfcDirection xsi:nil="true" ref="i132502" />
  </Axis>
- <RefDirection>
    <IfcDirection xsi:nil="true" ref="i132499" />
  </RefDirection>
  </IfcAxis2Placement3D>
- <IfcLocalPlacement id="i133112">
- <PlacementRelTo>
    <IfcLocalPlacement xsi:nil="true" ref="i132540" />
  </PlacementRelTo>
- <RelativePlacement>
    <IfcAxis2Placement3D xsi:nil="true" ref="i133111" />
  </RelativePlacement>
  </IfcLocalPlacement>
- <IfcCartesianPoint id="i133113">
- <Coordinates ex:cType="list">
    <IfcLengthMeasure>58.375</IfcLengthMeasure>
    <IfcLengthMeasure>0.0</IfcLengthMeasure>
  </Coordinates>
  </IfcCartesianPoint>
- <IfcPolyline id="i133114">
- <Points ex:cType="list">
    <IfcCartesianPoint pos="0" xsi:nil="true" ref="i132497" />
    <IfcCartesianPoint pos="1" xsi:nil="true" ref="i133113" />
  </Points>
  </IfcPolyline>
- <IfcShapeRepresentation id="i133115">
- <ContextOfItems>
    <IfcGeometricRepresentationContext xsi:nil="true" ref="i132529" />
  </ContextOfItems>
    <RepresentationIdentifier>Axis</RepresentationIdentifier>
```

```xml
    <RepresentationType>Curve2D</RepresentationType>
- <Items ex:cType="set">
  <IfcPolyline pos="0" xsi:nil="true" ref="i133114" />
  </Items>
  </IfcShapeRepresentation>
- <IfcProductDefinitionShape id="i133140">
- <Representations ex:cType="list">
  <IfcShapeRepresentation pos="0" xsi:nil="true" ref="i133115" />
  <IfcShapeRepresentation pos="1" xsi:nil="true" ref="i133139" />
  </Representations>
  </IfcProductDefinitionShape>
- <IfcWallStandardCase id="i133141">
  <GlobalId>2OHDIkzebEBwa4EcxRR15J</GlobalId>
- <OwnerHistory>
  <IfcOwnerHistory xsi:nil="true" ref="i132535" />
  </OwnerHistory>
  <Name>Basic Wall:Exterior - Brick on CMU:157723</Name>
  <ObjectType>Basic Wall:Exterior - Brick on CMU:250</ObjectType>
- <ObjectPlacement>
  <IfcLocalPlacement xsi:nil="true" ref="i133112" />
  </ObjectPlacement>
- <Representation>
  <IfcProductDefinitionShape xsi:nil="true" ref="i133140" />
  </Representation>
  <Tag>157723</Tag>
  </IfcWallStandardCase>
- <IfcWallStandardCase id="i133201">
  <GlobalId>2OHDIkzebEBwa4EcxRR119</GlobalId>
- <OwnerHistory>
  <IfcOwnerHistory xsi:nil="true" ref="i132535" />
  </OwnerHistory>
  <Name>Basic Wall:Exterior - Brick on CMU:157953</Name>
```

```xml
<ObjectType>Basic Wall:Exterior - Brick on CMU:250</ObjectType>
<ObjectPlacement>
  <IfcLocalPlacement xsi:nil="true" ref="i133165" />
</ObjectPlacement>
<Representation>
  <IfcProductDefinitionShape xsi:nil="true" ref="i133200" />
</Representation>
<Tag>157953</Tag>
</IfcWallStandardCase>
<IfcWallStandardCase id="i133262">
<GlobalId>2OHDIkzebEBwa4EcxRR1FP</GlobalId>
<OwnerHistory>
  <IfcOwnerHistory xsi:nil="true" ref="i132535" />
</OwnerHistory>
<Name>Basic Wall:Interior - 4 7/8" Partition (1-hr):158353</Name>
<ObjectType>Basic Wall:Interior - 4 7/8" Partition (1-hr):261</ObjectType>
<ObjectPlacement>
  <IfcLocalPlacement xsi:nil="true" ref="i133225" />
</ObjectPlacement>
<Representation>
  <IfcProductDefinitionShape xsi:nil="true" ref="i133261" />
</Representation>
<Tag>158353</Tag>
</IfcWallStandardCase>
<IfcWallStandardCase id="i133342">
<GlobalId>2OHDIkzebEBwa4EcxRR1Ef</GlobalId>
<OwnerHistory>
  <IfcOwnerHistory xsi:nil="true" ref="i132535" />
</OwnerHistory>
<Name>Basic Wall:Interior - 4 7/8" Partition (1-hr):158433</Name>
<ObjectType>Basic Wall:Interior - 4 7/8" Partition (1-hr):261</ObjectType>
<ObjectPlacement>
```

```xml
<IfcLocalPlacement xsi:nil="true" ref="i133305" />
</ObjectPlacement>
<Representation>
<IfcProductDefinitionShape xsi:nil="true" ref="i133341" />
</Representation>
<Tag>158433</Tag>
</IfcWallStandardCase>
<IfcAxis2Placement3D id="i135102">
<Location>
<IfcCartesianPoint xsi:nil="true" ref="i132496" />
</Location>
</IfcAxis2Placement3D>
<IfcLocalPlacement id="i135103">
<RelativePlacement>
<IfcAxis2Placement3D xsi:nil="true" ref="i135102" />
</RelativePlacement>
</IfcLocalPlacement>
<IfcCartesianPoint id="i135224">
<Coordinates ex:cType="list">
<IfcLengthMeasure>-43.47796</IfcLengthMeasure>
<IfcLengthMeasure>0.07953084</IfcLengthMeasure>
<IfcLengthMeasure>-1.0</IfcLengthMeasure>
</Coordinates>
</IfcCartesianPoint>
<IfcAxis2Placement3D id="i135225">
<Location>
<IfcCartesianPoint xsi:nil="true" ref="i135224" />
</Location>
</IfcAxis2Placement3D>
<IfcLocalPlacement id="i134655">
<PlacementRelTo>
<IfcLocalPlacement xsi:nil="true" ref="i132540" />
```

```xml
</PlacementRelTo>
<RelativePlacement>
<IfcAxis2Placement3D xsi:nil="true" ref="i135225" />
</RelativePlacement>
</IfcLocalPlacement>
<IfcAxis2Placement2D id="i134656">
<Location>
<IfcCartesianPoint xsi:nil="true" ref="i132497" />
</Location>
<RefDirection>
<IfcDirection xsi:nil="true" ref="i132507" />
</RefDirection>
</IfcAxis2Placement2D>
<IfcDirection id="i57094">
<DirectionRatios ex:cType="list">
<ex:double-wrapper>0.0</ex:double-wrapper>
<ex:double-wrapper>0.0</ex:double-wrapper>
<ex:double-wrapper>1.0</ex:double-wrapper>
</DirectionRatios>
</IfcDirection>
<IfcDirection id="i57095">
<DirectionRatios ex:cType="list">
<ex:double-wrapper>1.0</ex:double-wrapper>
<ex:double-wrapper>0.0</ex:double-wrapper>
<ex:double-wrapper>0.0</ex:double-wrapper>
</DirectionRatios>
</IfcDirection>
<IfcDirection id="i57096">
<DirectionRatios ex:cType="list">
<ex:double-wrapper>0.0</ex:double-wrapper>
<ex:double-wrapper>0.0</ex:double-wrapper>
<ex:double-wrapper>1.0</ex:double-wrapper>
```

```xml
    </DirectionRatios>
  </IfcDirection>
- <IfcCartesianPoint id="i57097">
- <Coordinates ex:cType="list">
    <IfcLengthMeasure>0.0</IfcLengthMeasure>
    <IfcLengthMeasure>0.0</IfcLengthMeasure>
    <IfcLengthMeasure>0.0</IfcLengthMeasure>
  </Coordinates>
  </IfcCartesianPoint>
- <IfcAxis2Placement3D id="i57098">
- <Location>
    <IfcCartesianPoint xsi:nil="true" ref="i57097" />
  </Location>
- <Axis>
    <IfcDirection xsi:nil="true" ref="i57096" />
  </Axis>
- <RefDirection>
    <IfcDirection xsi:nil="true" ref="i57095" />
  </RefDirection>
  </IfcAxis2Placement3D>
- <IfcCartesianPoint id="i57099">
- <Coordinates ex:cType="list">
    <IfcLengthMeasure>0.0</IfcLengthMeasure>
    <IfcLengthMeasure>0.0</IfcLengthMeasure>
  </Coordinates>
  </IfcCartesianPoint>
- <IfcCartesianPoint id="i57100">
- <Coordinates ex:cType="list">
    <IfcLengthMeasure>7075.0</IfcLengthMeasure>
    <IfcLengthMeasure>0.0</IfcLengthMeasure>
  </Coordinates>
  </IfcCartesianPoint>
```

```xml
<IfcCartesianPoint id="i57101">
  <Coordinates ex:cType="list">
    <IfcLengthMeasure>7275.0</IfcLengthMeasure>
    <IfcLengthMeasure>200.0</IfcLengthMeasure>
  </Coordinates>
</IfcCartesianPoint>
<IfcCartesianPoint id="i57102">
  <Coordinates ex:cType="list">
    <IfcLengthMeasure>-200.0</IfcLengthMeasure>
    <IfcLengthMeasure>200.0</IfcLengthMeasure>
  </Coordinates>
</IfcCartesianPoint>
<IfcPolyline id="i57103">
  <Points ex:cType="list">
    <IfcCartesianPoint pos="0" xsi:nil="true" ref="i57099" />
    <IfcCartesianPoint pos="1" xsi:nil="true" ref="i57100" />
    <IfcCartesianPoint pos="2" xsi:nil="true" ref="i57101" />
    <IfcCartesianPoint pos="3" xsi:nil="true" ref="i57102" />
    <IfcCartesianPoint pos="4" xsi:nil="true" ref="i57099" />
  </Points>
</IfcPolyline>
<IfcArbitraryClosedProfileDef id="i57104">
  <ProfileType>area</ProfileType>
  <OuterCurve>
    <IfcPolyline xsi:nil="true" ref="i57103" />
  </OuterCurve>
</IfcArbitraryClosedProfileDef>
<IfcExtrudedAreaSolid id="i57105">
  <SweptArea>
    <IfcArbitraryClosedProfileDef xsi:nil="true" ref="i57104" />
  </SweptArea>
  <Position>
```

```xml
    <IfcAxis2Placement3D xsi:nil="true" ref="i57098" />
  </Position>
- <ExtrudedDirection>
    <IfcDirection xsi:nil="true" ref="i57094" />
  </ExtrudedDirection>
  <Depth>2380.0</Depth>
  </IfcExtrudedAreaSolid>
- <IfcShapeRepresentation id="i57106">
- <ContextOfItems>
    <IfcGeometricRepresentationContext xsi:nil="true" ref="i56266" />
  </ContextOfItems>
  <RepresentationIdentifier>Body</RepresentationIdentifier>
  <RepresentationType>SweptSolid</RepresentationType>
- <Items ex:cType="set">
    <IfcExtrudedAreaSolid pos="0" xsi:nil="true" ref="i57105" />
  </Items>
  </IfcShapeRepresentation>
- <IfcProductDefinitionShape id="i57107">
- <Representations ex:cType="list">
    <IfcShapeRepresentation pos="0" xsi:nil="true" ref="i57093" />
    <IfcShapeRepresentation pos="1" xsi:nil="true" ref="i57106" />
  </Representations>
  </IfcProductDefinitionShape>
- <IfcWallStandardCase id="i57108">
  <GlobalId>2W8WOlCDv65eg4yPUIHfne</GlobalId>
- <OwnerHistory>
    <IfcOwnerHistory xsi:nil="true" ref="i56258" />
  </OwnerHistory>
  <Name>Stahlbeton</Name>
- <ObjectPlacement>
    <IfcLocalPlacement xsi:nil="true" ref="i57089" />
  </ObjectPlacement>
```

```
- <Representation>
  <IfcProductDefinitionShape xsi:nil="true" ref="i57107" />
  </Representation>
  </IfcWallStandardCase>
  </uos>
  </iso_10303_28>
```

Table 4 shows contents of example interoperability data objects, e.g., shown at 306 as created by the module shown at 304.

Table 4 file name:c:\tmp\debugWall4_2.xml
Parsing Basic Walls...
\*\*\*No of walls (short):7
BasicWall: Id:i132903,name:Basic Wall:Exterior - Brick on CMU:157571
, ObjPlacementLocPlaceRef:i132849, prodDefShapeRef:i132902
BasicWall: Id:i133088,name:Basic Wall:Exterior - Brick on CMU:157673
, ObjPlacementLocPlaceRef:i133052, prodDefShapeRef:i133087
BasicWall: Id:i133141,name:Basic Wall:Exterior - Brick on CMU:157723
, ObjPlacementLocPlaceRef:i133112, prodDefShapeRef:i133140
BasicWall: Id:i133201,name:Basic Wall:Exterior - Brick on CMU:157953
, ObjPlacementLocPlaceRef:i133165, prodDefShapeRef:i133200
BasicWall: Id:i133262,name:Basic Wall:Interior - 4 7/8" Partition (1-hr):158353
, ObjPlacementLocPlaceRef:i133225, prodDefShapeRef:i133261
BasicWall: Id:i133342,name:Basic Wall:Interior - 4 7/8" Partition (1-hr):158433
, ObjPlacementLocPlaceRef:i133305, prodDefShapeRef:i133341
BasicWall: Id:i57108,name:Stahlbeton
, ObjPlacementLocPlaceRef:i57089, prodDefShapeRef:i57107
tmpObjPRef:i57089, basicWall:true, locplace:false, PlaceRelTo:false
Processing WallPlacementPath of wall #0, id:i132903

```
***locplace:false, basicWall:true, qNameIfcLocalPlacement, id:i132849,idref:null, ref:i132849, PlaceRelTo:false found IfcLocalPlacement:i132849, locplace set to true PLP (PRT ref): basicWall:true, qName:IfcLocalPlacement, id:true,idref:i132540, locplace:true, PlaceRelTo:true Found PlaceRelativeTo -IfcLocalPlacement(2nd value):i132540

PLP (RP ref): basicWall:true, qName:IfcAxis2Placement3D, id:true,idref:i132848, locplace:true, relativePlace:true Found RelativePlaceAxis2P3DRef -IfcAxis2Placement3D(2nd value):i132848 set RelativePlaceAxis2P3DRef -i132848

***prodDef:true, basicWall:true, qNameIfcProductDefinitionShapeid:i132902,idref:null, refi132902 found ProductDefinitionShape:i132902, prodDefShape set to true

***qName:IfcShapeRepresentation, id:0,idref:true,idref2:i132852, ref:i132902 idref2:i132852 added to ShapeRepresentationList

Processing IfcAxis2Placement3D cartesianPoint ref of WallPlacementPath: #0

***locplace:false, basicWall:true, qNameIfcLocalPlacement, id:i132540,idref:null, ref:i132540, PlaceRelTo:false found IfcLocalPlacement:i132540, locplace set to true PLP (PRT ref): basicWall:true, qName:IfcLocalPlacement, id:true,idref:i132527, locplace:true, PlaceRelTo:true prtlpList - idref:i132527, sz=1

Found PlaceRelativeTo -IfcLocalPlacement(2nd value):i132527

PLP (RP ref): basicWall:true, qName:IfcAxis2Placement3D, id:true,idref:i132539, locplace:true, relativePlace:true prtlpList - idref:i132539, sz=1

Found RelativePlaceAxis2P3DRef -IfcAxis2Placement3D(2nd value):i132539

***shapeRep:true, basicWall:true, qName:IfcShapeRepresentationid:i132852,idref:null, ref:i132852
``` found ShapeRepresentation:i132852, prodDefShape set to true

***qName:IfcGeometricRepresentationContext, id:true,2nd value - idref:i132529, ref:i132852

***qName:RepresentationIdentifier

***geoRepId value:Axis

***qName:RepresentationType

***geoRepType value:Curve2D

***qName:IfcPolyline, id:0,idref:true,idref2:i132851 getPlacementRelToRefValues...

***locplace:false, basicWall:true, qNameIfcLocalPlacement, id:i132527,idref:null, ref:i132527, PlaceRelTo:false found IfcLocalPlacement:i132527, locplace set to true PLP (PRT ref): basicWall:true, qName:IfcLocalPlacement, id:true,idref:i135103, locplace:true, PlaceRelTo:true prtlpList - idref:i135103, sz=2

Found PlaceRelativeTo -IfcLocalPlacement(2nd value):i135103

PLP (RP ref): basicWall:true, qName:IfcAxis2Placement3D, id:true,idref:i132526, locplace:true, relativePlace:true prtlpList - idref:i132526, sz=2

Found RelativePlaceAxis2P3DRef -IfcAxis2Placement3D(2nd value):i132526

***geoRepContext:true, qName:IfcGeometricRepresentationContextid:i132529,idref:null, ref:i132529 found ShapeRepresentation:i132529, prodDefShape set to true

***qName:ContextType

***geoRepContextType value:Model

***qName:CoordinateSpaceDimension

***geoRepCordSpaceDim value:3

***qName:Precision

***geoRepPrecison value:1.0E-9

***qName:WorldCoordinateSystem

***geoRepContext:false, qName:IfcAxis2Placement3Did:true,idref:i132528, ref:i132529

***Found IfcPolyline:id:i132851, ref:i132851

***qName:IfcCartesianPoint, id:0,idref:true,idref2:i132497, ref:i132851

***getCartesianPointById found cp=i132497

***Found - getCPAddToList::: idref=i132497, found acp=i132497

***getCPAddToList successful: added i132497 to list

***qName:IfcCartesianPoint, id:1,idref:true,idref2:i132850, ref:i132851

***getCartesianPointById found cp=i132850

***Found - getCPAddToList::: idref=i132850, found acp=i132850

***getCPAddToList successful: added i132850 to list

***locplace:false, basicWall:true, qNameIfcLocalPlacement, id:i135103,idref:null, ref:i135103, PlaceRelTo:false found IfcLocalPlacement:i135103, locplace set to true PLP (RP ref): basicWall:true, qName:IfcAxis2Placement3D, id:true,idref:i135102, locplace:true, relativePlace:true prtlpList - idref:i135102, sz=3

Found RelativePlaceAxis2P3DRef -IfcAxis2Placement3D(2nd value):i135102 setting gotAix2P3DCPRefFlag

Processing to get all Axis2Placement3D cartesianPoint values...

***print original ordering of rpAxis2PList: . sz=4 i132848,i132539,i132526,i135102, rpAxis2PList.size =4; **sorted ordering of rpAxis2PList:

i132526,i132539,i132848,i135102,

Found A2P3DCartesianPoint:i132526

Found IfcCartesianPoint ref -IfcCartesianPoint(2nd value):i132496 qname=IfcCartesianPoint,id=true, idref=i132496, ref=i132526 ref=i132526, aWall.getRelativePlaceAxis2P3DRef()=i132848

***getCartesianPointById found cp=i132496

***Found - getCPAddToList::: idref=i132496, found acp=i132496

***getCPAddToList successful: added i132496 to list inc'ed idx: rpAxis2PListIdx=1

Found A2P3DCartesianPoint:i132539

Found IfcCartesianPoint ref -IfcCartesianPoint(2nd value):i132496 qname=IfcCartesianPoint,id=true, idref=i132496, ref=i132526 ref=i132526, aWall.getRelativePlaceAxis2P3DRef()=i132848

***getCartesianPointById found cp=i132496

***Found - getCPAddToList::: idref=i132496, found acp=i132496

***getCPAddToList successful: added i132496 to list inc'ed idx: rpAxis2PListIdx=2

Found A2P3DCartesianPoint:i132539

Found IfcCartesianPoint ref -IfcCartesianPoint(2nd value):i132496 qname=IfcCartesianPoint,id=true, idref=i132496, ref=i132526 ref=i132526, aWall.getRelativePlaceAxis2P3DRef()=i132848

***getCartesianPointById found cp=i132496

***Found - getCPAddToList::: idref=i132496, found acp=i132496

***getCPAddToList successful: added i132496 to list inc'ed idx: rpAxis2PListIdx=3

Found A2P3DCartesianPoint:i132848

Found IfcCartesianPoint ref -IfcCartesianPoint(2nd value):i132847 qname=IfcCartesianPoint,id=true, idref=i132847, ref=i132526 ref=i132526, aWall.getRelativePlaceAxis2P3DRef()=i132848 setRelativePlaceAxis2P3DRef_CPRef to i132847

***getCartesianPointById found cp=i132847

***Found - getCPAddToList::: idref=i132847, found acp=i132847

***getCPAddToList successful: added i132847 to list inc'ed idx: rpAxis2PListIdx=4

***locplace:false, basicWall:true, qNameIfcLocalPlacement, id:i135103,idref:null, ref:i135103, PlaceRelTo:false found IfcLocalPlacement:i135103, locplace set to true PLP (RP ref): basicWall:true, qName:IfcAxis2Placement3D, id:true,idref:i135102, locplace:true, relativePlace:true prtlpList - idref:i135102, sz=4 prtlpList - found idref:i135102 tmpObjPRef:i132851, basicWall:true, locplace:false, PlaceRelTo:false

Processing WallPlacementPath of wall #1, id:i133088

Processing IfcAxis2Placement3D cartesianPoint ref of WallPlacementPath: #1 getPlacementRelToRefValues...

setting gotAix2P3DCPRefFlag

Processing to get all Axis2Placement3D cartesianPoint values...

tmpObjPRef:i133087, basicWall:true, locplace:false, PlaceRelTo:false

Processing WallPlacementPath of wall #2, id:i133141

***locplace:false, basicWall:true, qNameIfcLocalPlacement, id:i133112,idref:null, ref:i133112, PlaceRelTo:false found IfcLocalPlacement:i133112, locplace set to true PLP (PRT ref): basicWall:true, qName:IfcLocalPlacement, id:true,idref:i132540, locplace:true, PlaceRelTo:true Found PlaceRelativeTo -IfcLocalPlacement(2nd value):i132540

PLP (RP ref): basicWall:true, qName:IfcAxis2Placement3D, id:true,idref:i133111, locplace:true, relativePlace:true Found RelativePlaceAxis2P3DRef -IfcAxis2Placement3D(2nd value):i133111 set RelativePlaceAxis2P3DRef -i133111

Processing IfcAxis2Placement3D cartesianPoint ref of WallPlacementPath: #2

***locplace:false, basicWall:true, qNameIfcLocalPlacement, id:i132540,idref:null, ref:i132540, PlaceRelTo:false found IfcLocalPlacement:i132540, locplace set to true PLP (PRT ref): basicWall:true, qName:IfcLocalPlacement, id:true,idref:i132527, locplace:true, PlaceRelTo:true prtlpList - idref:i132527, sz=1

Found PlaceRelativeTo -IfcLocalPlacement(2nd value):i132527

PLP (RP ref): basicWall:true, qName:IfcAxis2Placement3D, id:true,idref:i132539, locplace:true, relativePlace:true prtlpList - idref:i132539, sz=1

Found RelativePlaceAxis2P3DRef -IfcAxis2Placement3D(2nd value):i132539 getPlacementRelToRefValues...

\*\*\*locplace:false, basicWall:true, qNameIfcLocalPlacement, id:i132527,idref:null, ref:i132527, PlaceRelTo:false found IfcLocalPlacement:i132527, locplace set to true PLP (PRT ref): basicWall:true, qName:IfcLocalPlacement, id:true,idref:i135103, locplace:true, PlaceRelTo:true prtlpList - idref:i135103, sz=2

Found PlaceRelativeTo -IfcLocalPlacement(2nd value):i135103

PLP (RP ref): basicWall:true, qName:IfcAxis2Placement3D, id:true,idref:i132526, locplace:true, relativePlace:true prtlpList - idref:i132526, sz=2

Found RelativePlaceAxis2P3DRef -IfcAxis2Placement3D(2nd value):i132526

\*\*\*locplace:false, basicWall:true, qNameIfcLocalPlacement, id:i135103,idref:null, ref:i135103, PlaceRelTo:false found IfcLocalPlacement:i135103, locplace set to true PLP (RP ref): basicWall:true, qName:IfcAxis2Placement3D, id:true,idref:i135102, locplace:true, relativePlace:true prtlpList - idref:i135102, sz=3

Found RelativePlaceAxis2P3DRef -IfcAxis2Placement3D(2nd value):i135102 setting gotAix2P3DCPRefFlag

Processing to get all Axis2Placement3D cartesianPoint values...

\*\*\*locplace:false, basicWall:true, qNameIfcLocalPlacement, id:i135103,idref:null, ref:i135103, PlaceRelTo:false

```
found IfcLocalPlacement:i135103, locplace set to true
PLP (RP ref): basicWall:true, qName:IfcAxis2Placement3D, id:true,idref:i135102, locplace:true, relativePlace:true
prtlpList - idref:i135102, sz=4
prtlpList - found idref:i135102
tmpObjPRef:i133140, basicWall:true, locplace:false, PlaceRelTo:false
Processing WallPlacementPath of wall #3, id:i133201
Processing IfcAxis2Placement3D cartesianPoint ref of WallPlacementPath: #3
getPlacementRelToRefValues...
setting gotAix2P3DCPRefFlag
Processing to get all Axis2Placement3D cartesianPoint values...
tmpObjPRef:i133200, basicWall:true, locplace:false, PlaceRelTo:false
Processing WallPlacementPath of wall #4, id:i133262
Processing IfcAxis2Placement3D cartesianPoint ref of WallPlacementPath: #4
getPlacementRelToRefValues...
setting gotAix2P3DCPRefFlag
Processing to get all Axis2Placement3D cartesianPoint values...
tmpObjPRef:i133261, basicWall:true, locplace:false, PlaceRelTo:false
Processing WallPlacementPath of wall #5, id:i133342
Processing IfcAxis2Placement3D cartesianPoint ref of WallPlacementPath: #5
getPlacementRelToRefValues...
setting gotAix2P3DCPRefFlag
Processing to get all Axis2Placement3D cartesianPoint values...
tmpObjPRef:i133341, basicWall:true, locplace:false, PlaceRelTo:false
Processing WallPlacementPath of wall #6, id:i57108
Processing IfcAxis2Placement3D cartesianPoint ref of WallPlacementPath: #6
getPlacementRelToRefValues...
setting gotAix2P3DCPRefFlag
Processing to get all Axis2Placement3D cartesianPoint values...
```

***print CartesianPointList list. sz=14

CartesianPoint: id=i132496, CP count=3, x=0.0. y=0.0, z=0.0

CartesianPoint: id=i132497, CP count=2, x=0.0. y=0.0, z=0.0

CartesianPoint: id=i132847, CP count=3, x=-43.47796. y=20.89203, z=0.0

CartesianPoint: id=i132850, CP count=2, x=61.625. y=-0.0, z=0.0

CartesianPoint: id=i132893, CP count=3, x=1.625. y=-0.8125, z=11.21875

CartesianPoint: id=i132897, CP count=3, x=1.625. y=-0.8125, z=11.21875

CartesianPoint: id=i133110, CP count=3, x=16.52204. y=0.89203084, z=0.0

CartesianPoint: id=i133113, CP count=2, x=58.375. y=0.0, z=0.0

CartesianPoint: id=i135224, CP count=3, x=-43.47796. y=0.07953084, z=-1.0

CartesianPoint: id=i57097, CP count=3, x=0.0. y=0.0, z=0.0

CartesianPoint: id=i57099, CP count=2, x=0.0. y=0.0, z=0.0

CartesianPoint: id=i57100, CP count=2, x=7075.0. y=0.0, z=0.0

CartesianPoint: id=i57101, CP count=2, x=7275.0. y=200.0, z=0.0

CartesianPoint: id=i57102, CP count=2, x=-200.0. y=200.0, z=0.0

***No of walls:7

BasicWall: Id:i132903,name:Basic Wall:Exterior - Brick on CMU:157571

, ObjPlacementLocPlaceRef:i132849, prodDefShapeRef:i132902

, relativePlaceAxis2P3DRef:i132848, relativePlaceAxis2P3DRef_CPRef=i132847,

Axis2P3DCartesianRef:[i132496, i132496, i132496, i132847]

***print shapeRepresentationList list. sz=1 i132852,

GeometricRepresentationContext ref:i132529 representationId:Axis representationType:Curve2D itemType:IfcPolyline, reference:i132851

Polyline CP are 2 :

CartesianPoint: id=i132497, CP count=2, x=0.0. y=0.0, z=0.0

CartesianPoint: id=i132850, CP count=2, x=61.625. y=-0.0, z=0.0

***print prtlp (PlacementRelToLocPlaceRef)list. sz=3 i132540,i132527,i135103,

***print rpAxis2P (RelativePlaceAxis2P3DRef). sz=4 i132848,i132539,i132526,i135102,

***print CartesianPRefPList list. sz=4 i132496,i132496,i132496,i132847,

***print CartesianPointList list. sz=4

CartesianPoint: id=i132496, CP count=3, x=0.0. y=0.0, z=0.0

CartesianPoint: id=i132496, CP count=3, x=0.0. y=0.0, z=0.0

CartesianPoint: id=i132496, CP count=3, x=0.0. y=0.0, z=0.0

CartesianPoint: id=i132847, CP count=3, x=-43.47796. y=20.89203, z=0.0

BasicWall: Id:i133088,name:Basic Wall:Exterior - Brick on CMU:157673

, ObjPlacementLocPlaceRef:i133052, prodDefShapeRef:i133087

, relativePlaceAxis2P3DRef:null, relativePlaceAxis2P3DRef_CPRef=null,

Axis2P3DCartesianRef:null

***print shapeRepresentationList list. sz=0

***print prtlp (PlacementRelToLocPlaceRef)list. sz=3 i132540,i132527,i135103,

***print rpAxis2P (RelativePlaceAxis2P3DRef). sz=4 i133111,i132539,i132526,i135102,

***print CartesianPointList list. sz=0

BasicWall: Id:i133141,name:Basic Wall:Exterior - Brick on CMU:157723

, ObjPlacementLocPlaceRef:i133112, prodDefShapeRef:i133140

, relativePlaceAxis2P3DRef:i133111, relativePlaceAxis2P3DRef_CPRef=null,

Axis2P3DCartesianRef:null

***print shapeRepresentationList list. sz=0
***print prtlp (PlacementRelToLocPlaceRef)list. sz=0
***print rpAxis2P (RelativePlaceAxis2P3DRef). sz=0
***print CartesianPointList list. sz=0

BasicWall: Id:i133201,name:Basic Wall:Exterior - Brick on CMU:157953
, ObjPlacementLocPlaceRef:i133165, prodDefShapeRef:i133200
, relativePlaceAxis2P3DRef:null, relativePlaceAxis2P3DRef_CPRef=null,
Axis2P3DCartesianRef:null
***print shapeRepresentationList list. sz=0
***print prtlp (PlacementRelToLocPlaceRef)list. sz=0
***print rpAxis2P (RelativePlaceAxis2P3DRef). sz=0
***print CartesianPointList list. sz=0

BasicWall: Id:i133262,name:Basic Wall:Interior - 4 7/8" Partition (1-hr):158353
, ObjPlacementLocPlaceRef:i133225, prodDefShapeRef:i133261
, relativePlaceAxis2P3DRef:null, relativePlaceAxis2P3DRef_CPRef=null,
Axis2P3DCartesianRef:null
***print shapeRepresentationList list. sz=0
***print prtlp (PlacementRelToLocPlaceRef)list. sz=0
***print rpAxis2P (RelativePlaceAxis2P3DRef). sz=0
***print CartesianPointList list. sz=0

BasicWall: Id:i133342,name:Basic Wall:Interior - 4 7/8" Partition (1-hr):158433
, ObjPlacementLocPlaceRef:i133305, prodDefShapeRef:i133341
, relativePlaceAxis2P3DRef:null, relativePlaceAxis2P3DRef_CPRef=null,
Axis2P3DCartesianRef:null
***print shapeRepresentationList list. sz=0
***print prtlp (PlacementRelToLocPlaceRef)list. sz=0

\*\*\*print rpAxis2P (RelativePlaceAxis2P3DRef). sz=0

\*\*\*print CartesianPointList list. sz=0

BasicWall: Id:i57108,name:Stahlbeton

, ObjPlacementLocPlaceRef:i57089, prodDefShapeRef:i57107

, relativePlaceAxis2P3DRef:null, relativePlaceAxis2P3DRef_CPRef=null,

Axis2P3DCartesianRef:null

\*\*\*print shapeRepresentationList list. sz=0

\*\*\*print prtlp (PlacementRelToLocPlaceRef)list. sz=0

\*\*\*print rpAxis2P (RelativePlaceAxis2P3DRef). sz=0

\*\*\*print CartesianPointList list. sz=0

Exercise APIs...

wall 0 id =i132903

GeometricRepresentationContext ref:i132529 representationId:Axis representationType:Curve2D itemType:IfcPolyline, reference:i132851

Polyline CP are 2 :

CartesianPoint: id=i132497, CP count=2, x=0.0. y=0.0, z=0.0

CartesianPoint: id=i132850, CP count=2, x=61.625. y=-0.0, z=0.0

GeometricRepresentationContextType:Model coordSpaceDim:3 precison:1.0E-9 worldCoordSystemRef:i132528

Figure 9:
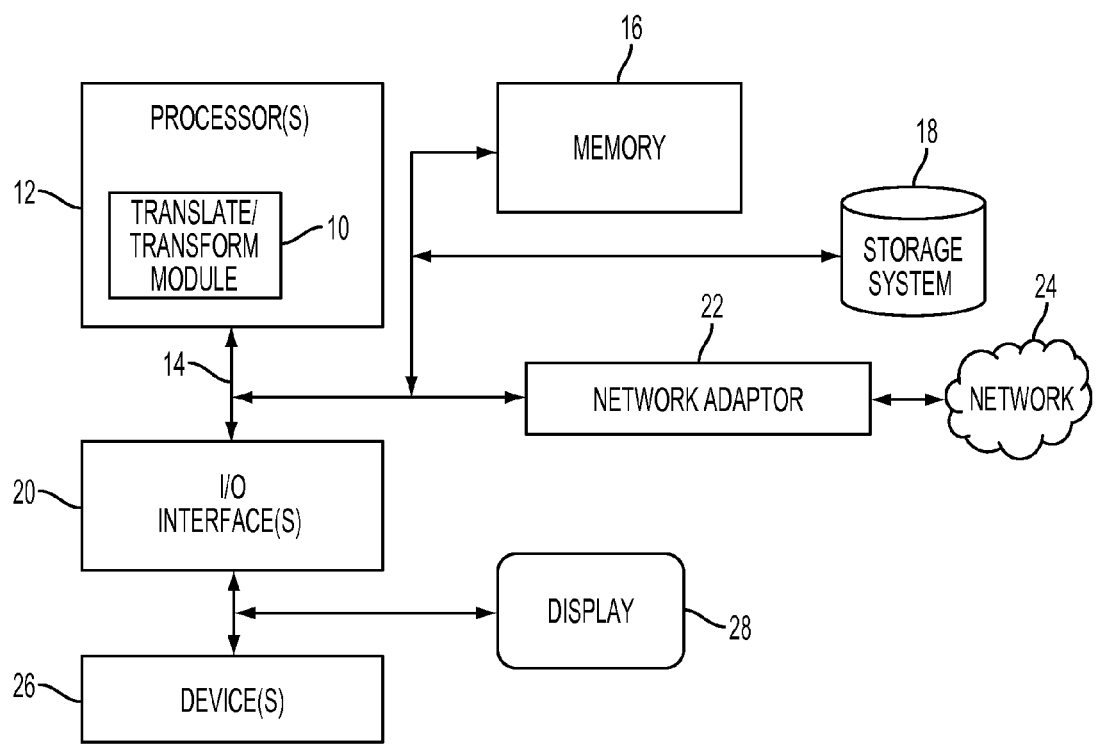
FIG. 9 illustrates a schematic of an example computer or processing system that may implement the translation/transformation methodology in one embodiment of the present disclosure.

FIG. 9 illustrates a schematic of an example computer or processing system that may implement the translation/transformation methodology of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 9 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include one or more components of a translation/transformation module 10 that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method for automatically translating and transforming a building architecture file format to a simulation file, comprising:
   extracting from a building architecture file, data and metadata used by a target simulation tool;
   creating interoperability data objects and storing the extracted data in the interoperability data objects;
   preparing a model translation procedure to identify a mapping from a Model View Definition to a translation and transformation function;
   transforming the extracted data using the data stored in the interoperability data objects, an input Model View Definition template, and the translation and transformation function to convert the extracted data to correct geometric values needed for a target simulation file format used by the target simulation tool; and
   generating the simulation file in the target simulation file format,
   wherein the preparing of the model translation procedure comprises:
   creating translation function definitions; and
   filling in the translation and transformation function with data of the one or more interoperability data objects,
   wherein the translating and transforming function comprises:
   a function to perform geometric transformation of data values stored in the interoperability data objects to specific building simulation models by converting the data values to geometric values based on at least offset, clipping, and rotation to represent a placement on an energy simulation model file;
   logic to perform the transforming of the extracted data stored in the interoperability data objects into the target simulation file format; and
   a function to fill in the module view definition template with the converted geometric values for the simulation file in the target simulation file format.

2. The method of claim 1, wherein the extracting of the data and metadata from the building architecture file comprises:
   parsing and extracting geometric data, the metadata, and context data from a selected subset of IFC elements of the building architecture file, the selected subset including only items needed by the target simulation tool, using an XML parser and governed by a set of parsing rules;
   retrieving IFC elements of the building architecture file using web-based APIs from a building information management data file repository to extract geometric data, the metadata, and context data; or
   combinations thereof.

3. The method of claim 1, wherein the parsing rules comprises handling reading elements in a reversed order.

4. The method of claim 1, wherein the storing of the extracted data in the interoperability data objects comprises storing geometric data values, the metadata and context data from the building architecture file.

5. The method of claim 1, wherein the interoperability data objects represent a set of selected building objects needed to generate a target simulation file used by the target simulation tool.

6. The method of claim 1, further comprising invoking one or more interoperability data objects query APIs to retrieve the data for filling in the translation and transformation function.

7. The method of claim 1, wherein the transforming of the extracted data further comprises translating and transforming the extracted data to geometric values needed for the target simulation file format.

8. The method of claim 1, wherein the Model View Definition template comprises schema formats of both the building architecture file and the simulation file, and a set of queries to the interoperability data objects.

9. The method of claim 8, wherein the set of queries to the interoperability data objects is supported by a building interoperability database schema.

10. The method of claim 9, wherein the building interoperability database schema uses relational object database structure to support related building object models.

11. The method of claim 1, wherein the generating of the simulation file comprises filling in an instance of the module view definition template with the transformed extracted data.

12. A method of automatically translating and transforming a building architecture file format to a simulation file, comprising:
   extracting geometry data, metadata and context data from an Industry Foundation Class architectural design file, the geometry data, metadata and context data selected based on a Model View Definition template;
   storing the extracted data as interoperability data objects;
   identifying a mapping from the Model View Definition template to one or more format translation and transformation functions; and
   translating and transformation the data stored as the interoperability data objects by executing said one or more format translation and transformation functions into a selected target simulation tool format,
   the translating and transforming function comprising:
   a function to perform geometric transformation of data values stored in the interoperability data objects to specific building simulation models by converting the data values to geometric values based on at least offset, clipping, and rotation to represent a placement on an energy simulation model file;
   logic to perform the transforming of the extracted data stored in the interoperability data objects into the target simulation file format; and
   a function to fill in the module view definition template with the converted geometric values for the simulation file in the target simulation file format.

13. The method of claim 12, further comprising:
   generating a target output file comprising the translated and transformed data in the selected target simulation tool format.

* * * * *